(12) United States Patent
Chang et al.

(10) Patent No.: US 6,732,341 B1
(45) Date of Patent: *May 4, 2004

(54) SYSTEM AND METHOD FOR USING SCALABLE POLYNOMIALS TO TRANSLATE A LOOK-UP TABLE DELAY MODEL INTO A MEMORY EFFICIENT MODEL

(75) Inventors: Shir-Shen Chang, Palo Alto, CA (US); Feng Wang, Mountain View, CA (US)

(73) Assignee: Synopsys Inc., Mountain View, CA (US)

( * ) Notice: Subject to any disclaimer, the term of this patent is extended or adjusted under 35 U.S.C. 154(b) by 175 days.

This patent is subject to a terminal disclaimer.

(21) Appl. No.: 09/737,525

(22) Filed: Dec. 13, 2000

Related U.S. Application Data

(63) Continuation of application No. 09/090,298, filed on Jun. 3, 1998, now Pat. No. 6,272,664.

(51) Int. Cl.$^7$ .............................. G06F 17/50; G06F 9/45
(52) U.S. Cl. ........................ 716/6; 716/2; 716/3; 716/4
(58) Field of Search ................................ 716/6, 2, 3, 4

(56) References Cited

U.S. PATENT DOCUMENTS

| | | | |
|---|---|---|---|
| 5,692,160 A | | 11/1997 | Sarin |
| 5,819,205 A | | 10/1998 | Mani |
| 6,028,995 A | * | 2/2000 | Jetton et al. ................... 703/19 |
| 6,272,664 B1 | * | 8/2001 | Chang et al. ................... 716/3 |

OTHER PUBLICATIONS

Croix et al., A Fast and Accurate Technique to Optimize Characterization Tables for Logic Synthesis, Proceedings of the 34$^{th}$ Design Automation Conference, pp. 337–340, Jun. 1997.*

Croix, J.F. et al., A Fast and Accurate Technique to Optimize Characterization Tables for Logic Synthesis, Proceedings 34$^{th}$ Design Automation Conference, pp. 337–340, Jun. 1997.

Thakur, S. et al, Simultaneous Area and Delay Minimum K–LUT Mapping for K–Exact Networks, pp. 402–408, Oct. 1995.

Abraham, J., Power Calculation and Modeling in Deep Submicron, Proceedings International Symposium on Low Power Electronics and Design, 1998, pp. 124–126, Aug. 1998.

Wang, Gaofeng et al., Efficient Generation of Timing and Power Polynomial Models from Lookup Tables for SoC Designs, Twelfth IEEE International ASIC/SOC Conference, 1999, pp. 216–220, Sep. 1999.

Mosher, John et al., Taylor Series Expansion and Modified Extended Prony Analysis for Localization, 28$^{th}$ Asilomar Conference on Signals, Systems and Computers, pp. 667–670, Nov. 1994.

Numerical Recipes in C: The Art of Scientific Computing ISBN 0–521–43108–5. Cambridge University Press. Chapter 6, pp. 212–220.

Numerical Recipes in C: The Art of Scientific Computing ISBN 0–521–43108–5. Cambridge University Press, Chapter 15, pp. 656–706.

\* cited by examiner

*Primary Examiner*—A. M. Thompson
(74) *Attorney, Agent, or Firm*—Bever, Hoffman & Harms, LLP; Jeanette S. Harms

(57) ABSTRACT

A system and method for using scalable polynomials to translate a look-up table delay model into a memory efficient model. The system of the present invention receives an input library of predefined cells having a number of predefined look-up tables for modeling timing arcs through circuit paths of the cells. The present invention analyzes each memory inefficient look-up table and selects a polynomial form for representing the timing data of the look-up table. The polynomial form is selected from polynomial systems. For a particular selected polynomial form, the present invention performs a curve fitting analysis to determine the proper coefficients. The selected polynomial is then accepted or rejected based on a Chi-Square analysis. If accepted, the memory efficient polynomial replaces the look-up table. If rejected, a next polynomial form is selected and processing is re-done. If no acceptable polynomial form is found, the look-up table is not replaced.

11 Claims, 24 Drawing Sheets

□ Decomposed Taylor Series

- $D = (a_0 + a_1 x + a_2 x^2 + ... + a_m x^m)(b_0 + b_1 y + b_2 y^2 + ...b_n y^n)$ ← 510

$= a_{00} + (a_{10} x + a_{01} y + a_{11} xy) +$
  $(a_{02} x^2 + a_{20} y^2 + a_{12} xy^2 + a_{21} x^2 y + a_{22} x^2 y^2) + ...$

- $(m+1)(n+1)$ coefficients for order $(m, n)$ ← 515

□ Joint Taylor Series

- $D = a_{00} + (a_{10} x + a_{10} y) + (a_{20} x^2 + a_{02} y^2 + a_{11} xy) + ...$ ← 520

- $(n+1)(n+2)/2$ coefficients for order $n$ ← 525

FIGURE 11

Linear Least Square Error (LSE) Curve Fitting $$\text{minimize } \chi^2 = \sum_i \left( \frac{y_i - Y_i}{\sigma_i} \right)^2 \quad \leftarrow 550$$

$y_i$: the sample point value $Y_i$: the calculated value $\sigma_i$: the variance of $y_i$

|     | $x_0$    | $x_1$    | $x_2$    |
|-----|----------|----------|----------|
| $y_0$ | $f_{00}$ | $f_{10}$ | $f_{20}$ |
| $y_1$ | $f_{01}$ | $f_{11}$ | $f_{21}$ |
| $y_2$ | $f_{02}$ | $f_{12}$ | $f_{22}$ |

| 570a | 570b | 570c | 570d | 570f |
|---|---|---|---|---|
| A | B | C | D | $f_{i,j}$ |
| 1/60 | $x_0/60$ | $y_0/60$ | $x_0^2/60$ | $f_{00}$ |
| 1/61 | $x_0/61$ | $y_1/61$ | $x_1^2/61$ | $f_{01}$ |
| 1/62 | $x_0/62$ | $y_2/62$ | $x_2^2/62$ | $f_{02}$ |
| 1/63 | $x_1/63$ | $y_0/63$ | $x_3^2/63$ | $f_{10}$ |
| 1/64 | $x_1/64$ | $y_1/64$ | $x_4^2/64$ | $f_{11}$ |
| 1/65 | $x_1/65$ | $y_2/65$ | $x_5^2/65$ | $f_{12}$ |
| 1/66 | $x_2/66$ | $y_0/66$ | $x_6^2/66$ | $f_{20}$ |
| 1/67 | $x_2/67$ | $y_1/67$ | $x_7^2/67$ | $f_{21}$ |
| 1/68 | $x_2/68$ | $y_2/68$ | $x_8^2/68$ | $f_{22}$ |

FIGURE 14B

☐ Chi-square Analysis $$Q(a, x) = \frac{1}{\Gamma(a)} \int_x^\infty e^{-t} t^{a-1} dt \quad \leftarrow 580$$

Where N = number of given data points
M = number of coefficients
ν = N - M = degrees of freedom The $\chi^2$ probability, $Q(0.5\nu, 0.5\chi^2)$, represents the matching level of the data set and the particular polynomial.

A polynomial is accepted if $Q(0.5\nu, 0.5\chi^2) > 0.1$

| CIRCUIT PATH ID | POLYNOMIAL CODE | COEFFICIENT VALUES |
|---|---|---|
| 10 | (0,1) | A, B, ETC. |
| 34 | (0,1) | A, B, ETC. |
| 54 | (1,1) | A, B, ETC. |
| 112 | (1,0) | A, B, ETC. |
| 654 | (1,1) | A, B, ETC. |
| 37 | (2) | A, B, ETC. |
| * * * | * * * | * * * |
| 590 | (2,1) | A, B, ETC. |

910a     910b     910c

SYSTEM AND METHOD FOR USING SCALABLE POLYNOMIALS TO TRANSLATE A LOOK-UP TABLE DELAY MODEL INTO A MEMORY EFFICIENT MODEL

This application is a continuation of application Ser. No. 09/090,298 filed Jun. 3, 1998 now U.S. Pat. No. 6,272,664.

BACKGROUND OF THE INVENTION

1. Field of the Invention

The present invention relates to the field of electronic design automation (EDA). More specifically, the present invention relates to techniques for generating memory efficient technology libraries used for timing and power estimations.

2. Related Art

An electronic design automation (EDA) system is a computer software system used for designing integrated circuit (IC) devices. The EDA system typically receives one or more high level behavioral descriptions of an IC device (e.g., in HDL languages like VHDL, Verilog, etc.) and translates this high level design language description into netlists of various levels of abstraction. At a higher level of abstraction, a generic netlist is typically produced based on technology independent primitives. The generic netlist can be translated into a lower level technology-specific netlist based on a technology-specific library that has gate-specific models for timing and power estimation. A netlist describes the IC design and is composed of nodes (elements) and edges, e.g., connections between nodes, and can be represented using a directed cyclic graph structure having nodes which are connected to each other with signal lines. A single node can have multiple fan-ins and multiple fan-outs. The netlist is typically stored in computer readable media within the EDA system and processed and verified using many well known techniques. One result is a physical device layout in mask form which can be used to directly implement structures in silicon to realize the physical IC device.

The design flow for the design of integrated circuits (e.g., ASIC, microprocessors, microcontrollers, etc.) requires several descriptions of the design library that are used as input to different CAD tools. For instance, a synthesis library is typically required. The main loop in the IC design environment consists of describing the IC design in terms of primitive models from the synthesis library, verifying (e.g., functionality, power and timing constraints, etc.) through various verification techniques and then refining and correcting the IC design. During this process, timing and power estimations or ("simulations") are often performed by the computer system to optimize the IC design and to determine if the overall circuit design is maintaining prescribed timing and power constraints.

FIG. 1 illustrates an example library cell 10. Within a technology library, each signal path of a library cell 10 can have its own timing model. For instance, for cell 10, a first path from input 12 to output 30 can have one timing model while a second path from input 16 to output 30 can have a second timing model. The timing delay (or other constraint) through a path from one input to an output is called a timing arc. Library cell 10 has at least four timing arcs. A timing arc is modeled based on a function of two variables, usually the input transition rate and the output capacitance load. Originally, timing models for timing arcs were based on fixed-form linear equations of output capacitance load. Later, these timing models (e.g., for generic CMOS) were based on a linear equation including both of these two input variables (with fixed coefficients) and, similarly, the same linear equation form was used to model all of the gates of a given technology library. Although the linear equation form was the same for all gates, the coefficients of the linear equation could change from timing arc to timing arc within the same technology library. This allowed the timing calculations to be generalized across the entire technology library and thereby made the timing calculations easier to perform. However, the calculations were not entirely accurate because some library gates were not well modeled by the fixed-form linear equation. It is desired to provide a more accurate method for providing timing delay estimations within an EDA system.

To improve accuracy, piecewise linear analysis was introduced to simulation and this provided a linear representation in each region but used a two dimensional representation. Three dimensional (3-D) non-linear look-up tables were then introduced that used bilinear equations for interpolation within the data points of the table. Using this prior art modeling method, each timing arc of a technology library is represented by a separate look-up table. Each point of a look-up table is referenced by an input transition rate and an output capacitance load and represents a delay value. Interpolation and extrapolation functions are used to determine values in between the given data points. FIG. 2A illustrates an original look-up table provided by the user. FIG. 2B illustrates the interpolated results of FIG. 2A showing the accuracy of a look-up table approach particularly for tables with "abnormal" data, such as the data at the upper right corner of FIG. 2A.

Although look-up tables, like the ones shown in FIG. 2A and FIG. 2B, provide very accurate timing and power simulations, they unfortunately also consume relatively large amounts of memory resources within an EDA system as one technology library can contain as many as tens of thousands of look-up tables. For instance, each timing arc of each library cell can require its own individual look-up table data structure. Assuming each look-up table is 5×5 (e.g., consuming about 1.0 K bytes each) and assuming further that some technology libraries have over 1,000 cells per library, there can be between 5,000 and 20,000 look-up tables per technology library. Because multiple timing arcs can exist within each library cell, a single cell can require as much as 5–20 K bytes of memory storage for look-up tables. At this number, between 5.0 M bytes and 20.0 M bytes of memory can be required to provide delay data for a typical technology library. Further, large look-up table sizes slow down timing calculations. Because technology libraries are approaching 2,000 cells and further because users demand that design tools be able to deal with multiple different operating conditions (each of which requires a different set of timing data), it is desired to provide a more memory efficient method for providing timing delay estimations within an EDA system.

Accordingly, what is needed is a system and method for modeling the timing and/or the power for cells of a netlist that is memory efficient. Furthermore, what is needed is a system and method for accurately modeling the timing and/or power of cells of a netlist. In view of the above needs, the present invention provides a system and method for increasing the efficiency of an IC design process to thereby provide a faster, more cost effective and more accurate IC design process. These and other advantages of the present invention not specifically mentioned above will become clear within discussions of the present invention presented herein.

SUMMARY OF THE INVENTION

A system and are described herein for using scalable polynomials to translate a look-up table delay model into a memory efficient scalable polynomial-based model. The present invention recognizes that a set of scalable polynomials can effectively and efficiently be used to represent the timing and power information contained within the look-up tables of a technology library. The present invention allows each timing arc to have a different scalable polynomial thereby increasing timing calculation accuracy. Further, reducing look-up table models into polynomial models significantly reduces memory usage requirements and increases computation speed. The system of the present invention receives an input library of predefined cells having a number of predefined look-up tables for modeling the timing arcs of the cells. The look-up tables characterize the timing through the timing arcs of each of the cells of the input library. Each look-up table is referenced by two input variables (e.g., input transition rate and output load capacitance) which correspond to an output delay time through the timing arc.

The present invention analyzes each memory inefficient look-up table and selects a polynomial form (of two variables) for representing the timing data of the look-up table. The polynomial form is selected from a set of scalable polynomial systems (e.g., the decomposed Taylor Series and the Joint Taylor Series). The polynomial forms that are selected can have different orders (e.g., first, second, third, etc.) with respect to the input variables. For input look-up tables of a threshold size and smaller, an exhaustive process is used whereby polynomials are first selected with small orders and gradually larger orders are selected until an appropriate polynomial form is determined. For larger look-up tables, the selection of the polynomial order is first based on numerical differences.

For a particular selected polynomial form, the present invention performs a linear least square error (LSE) curve fitting analysis thereon to determine the proper set of coefficients for the selected polynomial form. The selected polynomial with coefficients is then accepted or rejected based on a Chi-Square analysis that is performed on the selected polynomial to avoid problems associated with oscillations due to over-fitting. If accepted, the memory efficient polynomial replaces the input look-up table and is stored in the technology library and subsequently used for timing calculation. If rejected, a next polynomial form is selected and processing is re-done. If no acceptable polynomial form can be found, the input look-up table is not replaced. By allowing different polynomial forms to represent the look-up tables, the present invention provides excellent timing accuracy for most library cells (e.g., five percent error or less) while reducing memory consumption by as much as 94 percent. The embodiments of the present invention are equally well suited for timing and power related computations.

Specifically, an embodiment of the present invention includes a computer implemented method comprising the steps of: a) accessing from memory a look-up table data structure for a cell, the look-up table data structure having timing data points each referenced by first and second input variables; b) translating the look-up table data structure into a selected polynomial form having a selected order and a set of coefficients and further having, as input variables, the input transition rate and the output load capacitance, wherein the selected polynomial form is selected out of a predetermined set of scalable polynomial forms; c) in the memory, replacing the look-up table data structure with the selected polynomial form; d) repeating steps a)–c) for a plurality of cells of a technology library stored in the memory; and e) using the selected polynomial forms to estimate timing delays through timing arcs of the plurality of cells of the technology library.

Embodiments include the above and wherein the first input variable is an input transition rate of an input of the cell and wherein the second input variable is an output load capacitance of an output of the cell and wherein the step b) comprises the steps of: b1) out of the predetermined set of scalable polynomial forms, selecting a first polynomial form of a first selected order, the first polynomial form having a first set of coefficients; b2) determining values for the first set of coefficients by performing a linear least square error curve fitting computation on the timing data points with respect to the first polynomial form; b3) performing a Chi-Square computation with respect to the timing data points and the first polynomial form including the values determined at step b2) to obtain a Chi-Square result; b4) accepting the first polynomial form including the values determined at step b2) provided the Chi-Square result is greater than a given threshold; and b5) provided the Chi-Square result is not greater than the given threshold, repeating steps b2)–b4) with respect to a second polynomial form having a second selected order and a second set of coefficients, wherein the second polynomial form is selected out of the predetermined set of scalable polynomial forms.

BRIEF DESCRIPTION OF THE DRAWINGS

FIG. 11 illustrates two scalable polynomial systems used for polynomial form selection in the translation process of FIG. 9 in accordance with the present invention.

FIG. 13 illustrates a linear least square error curve fitting analysis used in accordance with the present invention for coefficient value determination.

FIG. 14A illustrates an exemplary 3×3 look-up table input to the look-up table translation processes of FIG. 9 in accordance with the present invention.

FIG. 14B is an illustration of a data table used by the linear least square error processing of the present invention for coefficient determination.

FIG. 15 illustrates a Chi-Square analysis performed in accordance with the present invention for validating a selected polynomial form having computed coefficient values.

DETAILED DESCRIPTION OF THE INVENTION

Figure 1:
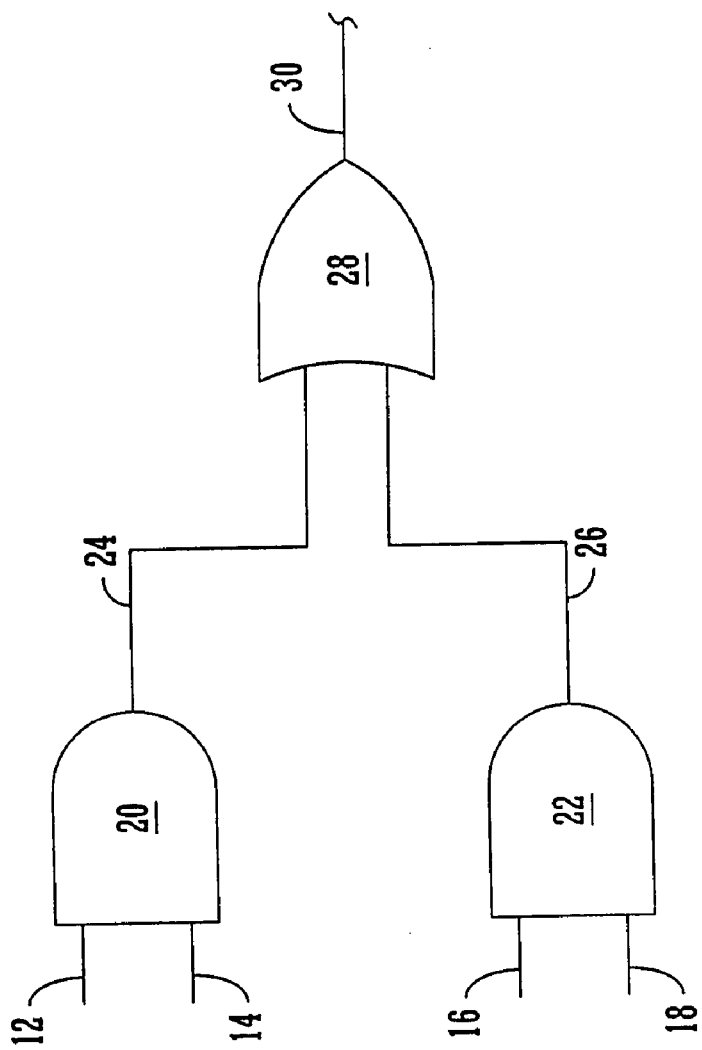
FIG. 1 is a schematic diagram of an exemplary circuit that has its timing arcs characterized by prior art look-up tables.
Figure 2A:
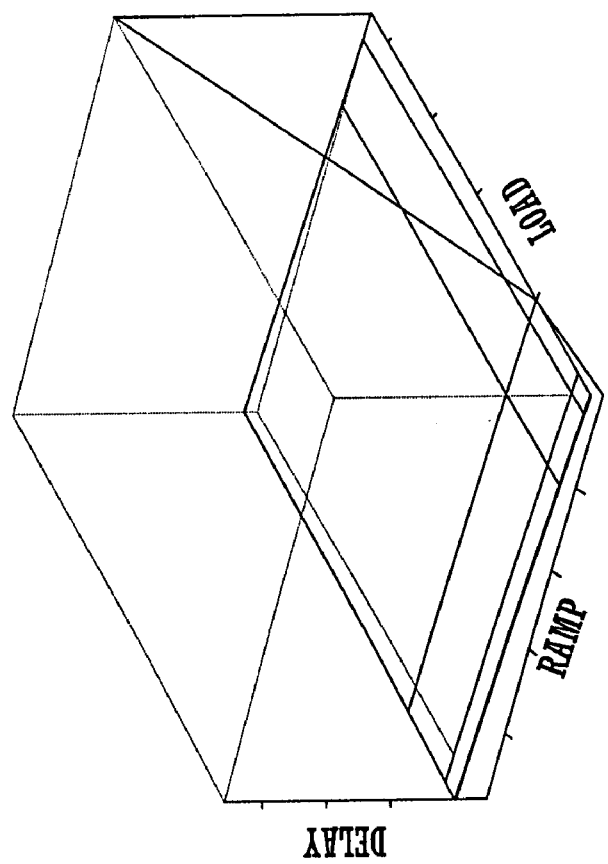
FIG. 2A illustrates a prior art look-up table for modeling timing arcs within a circuit library.
Figure 2B:
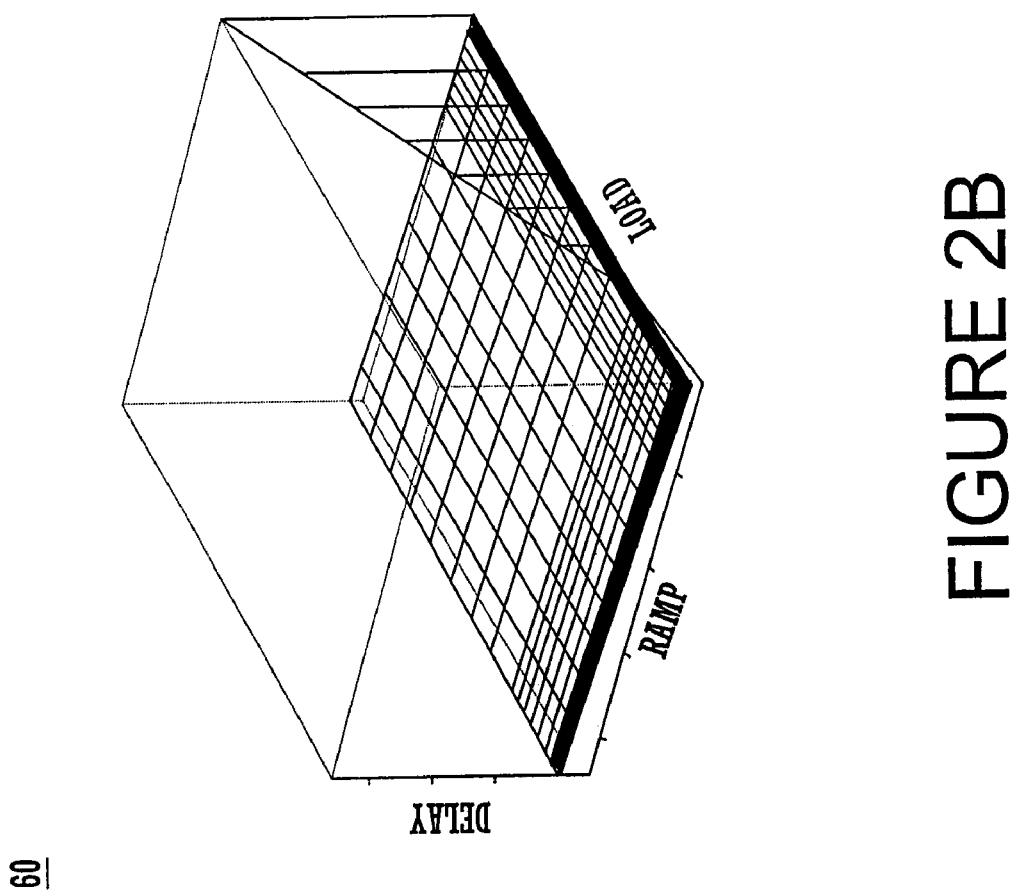
FIG. 2B shows the interpolated results based on the look-up table of FIG. 2A.

In the following detailed description of the present invention, a system and method for using scalable polynomials to translate a look-up table delay model into a memory efficient model, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "translating" or "calculating" or "determining or displaying" or "recognizing" or the like, refer to the action and processes of a computer system (e.g., FIG. 3), or similar electronic computing device, that manipulates and transforms data represented as physical (electronic) quantities within the computer system's registers and memories into other data similarly represented as physical quantities within the computer system memories or registers or other such information storage, transmission or display devices.

Computer System Platform 112

Aspects of the present invention, described below, are discussed in terms of steps executed on a computer system (e.g., processes 300, 325 and 800). These steps are implemented as program code stored in computer readable memory units of a computer system and are executed by the processor of the computer system. Although a variety of different computer systems can be used with the present invention, an exemplary general purpose computer system 112 is shown in FIG. 3.

In general, computer system 112 includes an address/data bus 100 for communicating information, a central processor 101 coupled with the bus for processing information and instructions, a volatile memory 102 (e.g., random access memory RAM) coupled with the bus 100 for storing information and instructions for the central processor 101 and a non-volatile memory 103 (e.g., read only memory ROM) coupled with the bus 100 for storing static information and instructions for the processor 101. Computer system 112 also includes a data storage device 104 ("disk subsystem") such as a magnetic or optical disk and disk drive coupled with the bus 100 for storing information and instructions and a display device 105 coupled to the bus 100 for displaying information to the computer user. Data storage device 104 can include one or more removable magnetic or optical storage media (e.g., diskettes, tapes) which are computer readable memories. Memory units of system 112 include 102, 103 and 104.

Figure 3:
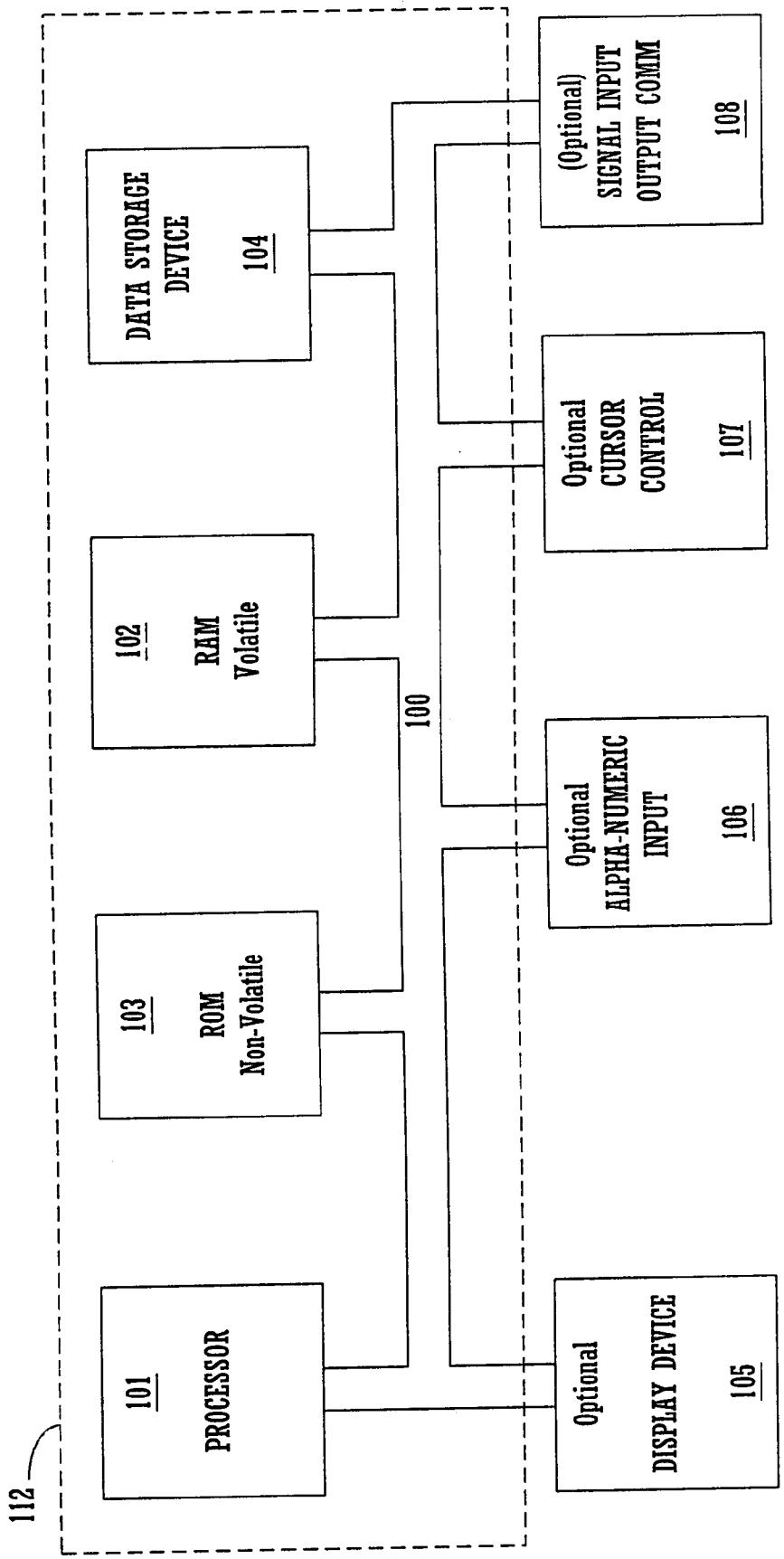
FIG. 3 is a general purpose computer system which provides an operational platform for embodiments of the present invention.

Also included in computer system 112 of FIG. 3 is an alphanumeric input device 106 including alphanumeric and function keys coupled to the bus 100 for communicating information and command selections to the central processor 101. Computer system 112 also includes a cursor control or directing device 107 coupled to the bus for communicating user input information and command selections to the central processor 101. Computer system 112 can also include an optional signal generating device 108 coupled to the bus 100 for interfacing with other networked computer systems. The display device 105 utilized with the computer system 112 of the present invention may be a liquid crystal device, other flat panel display, cathode ray tube, or other display device suitable for creating graphic images and alphanumeric characters recognizable to the user.

Look-Up Table to Polynomial Translation Process 300 of the Present Invention

Look-up table data structures (e.g., "tables") can be used to model ill-behaved functions. However, the present invention recognizes that many tables can be represented by low order polynomials with satisfactory accuracy. Advantageously, reducing tables into polynomials significantly reduces memory usage and speeds up timing calculations. Embodiments of the present invention adopt the use of Taylor series expansion to provide scalable polynomials. The present invention therefore uses scalable polynomials to replace those tables that can be replaced (the majority in most cases) within a subject technology library. It is advantageous to utilize polynomials as timing and power models because computer systems are well suited for internally performing computations based on polynomial terms and polynomial order and coefficients values can be varied for a custom fit for each table. The term "scalable" means that the form and order of the polynomials are automatically determined by the present invention based on the table data. Therefore, a tailored or "scaled" polynomial can be assigned for each table. However, a table is retained if it cannot be reduced in accordance with the rules of the present invention. Trials have shown that over 94% of the tables of typical technology libraries are reducible within a threshold level of acceptable accuracy The present invention maintains high timing (and power) calculation accuracy by using a predefined set of scalable polynomials for timing (and power) modeling. instead of a universal equation that attempts to fit all cases, as done in the prior art. In accordance with the present invention, each table of a subject technology library is analyzed and, if replaceable, custom fit with a polynomial obtained from a set of predefined scalable polynomial forms. The polynomial form selected and its computed coefficient values are then stored in memory and associated with the pertinent timing arc that was previously represented by the replaced table. Once replaced, the selected polynomial (and coefficient values) is used for timing (or power) calculations rather than the memory inefficient table. With controllable equation forms, the present invention is able to balance conflicting goals of speed, accuracy and memory usage for modeling the timing and power of the cells of the subject technology library.

Exemplary Look-Up Table Data Structures

The processes of the present invention transform look-up table data structures ("tables") of a subject technology library into scalable polynomial forms with computed coefficient values thereby reducing memory consumption for timing and for power computations. The following description illustrates the steps performed by the present invention for translating tables, used for modeling timing through timing arcs of cells, into scalable polynomial forms and computed coefficient values. However, it is appreciated that the present invention is equally well suited for transforming tables used for power computations.

Figure 4:
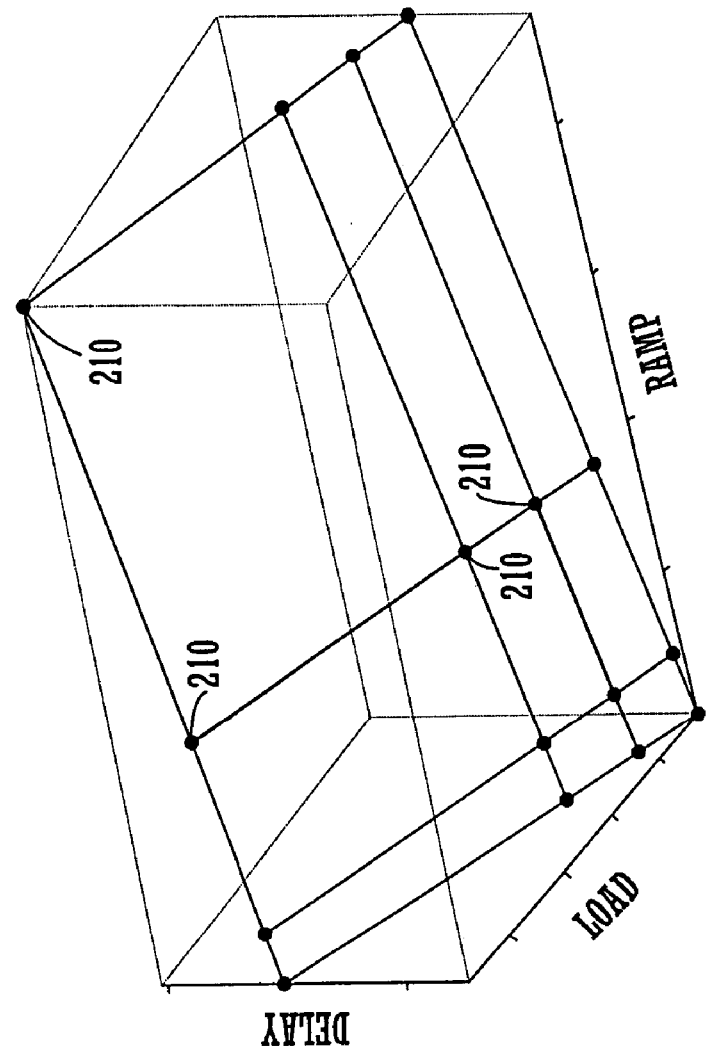
FIG. 4 illustrates a 4×4 look-up table data structure modeling the delay arc of an exemplary AND gate that is input to the translation processes of the present invention.
Figure 5:
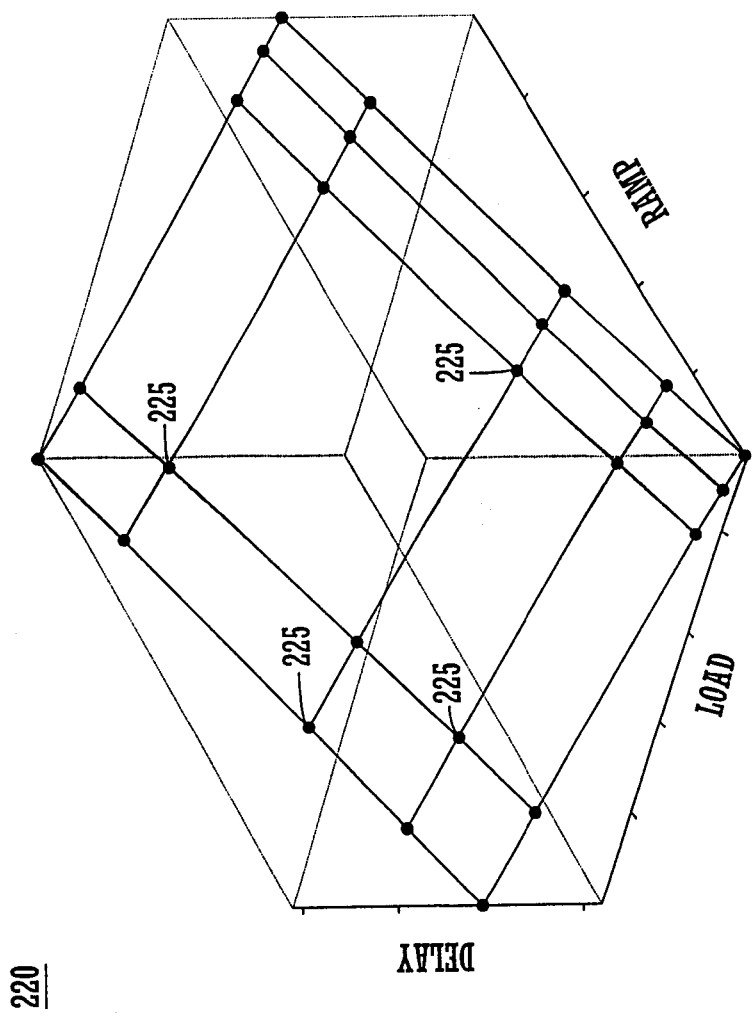
FIG. 5 illustrates a 5×5 look-up table data structure modeling the delay arc of an exemplary AND gate that is input to the translation processes of the present invention.

The following description illustrates exemplary timing look-up tables that are located within technology libraries that the present invention receives as input. FIG. 4 illustrates a (4×4) table 200 that models the delay arc of an AND gate. Within the bottom plane are the reference axis for the two input variables. The input variables are the input transition rate ("tramp") and the output load capacitance ("load"). The third dimension represents the 16 data points 210 of the look-up table 200. The data points 210 represent the delay through the timing or delay arc of the AND gate for the corresponding input variables. FIG. 5 illustrates a (5×5) table 220 that models the delay arc of an adder cell. Within the bottom plane are the reference axis for the two input variables. The input variables are the input transition rate ("ramp") and the output load capacitance ("load"). The third dimension represents the 25 data points 225 of the look-up table 220. The data points 225 represent the delay through the timing or delay arc of the exemplary adder cell for the corresponding input variables.

Figure 6:
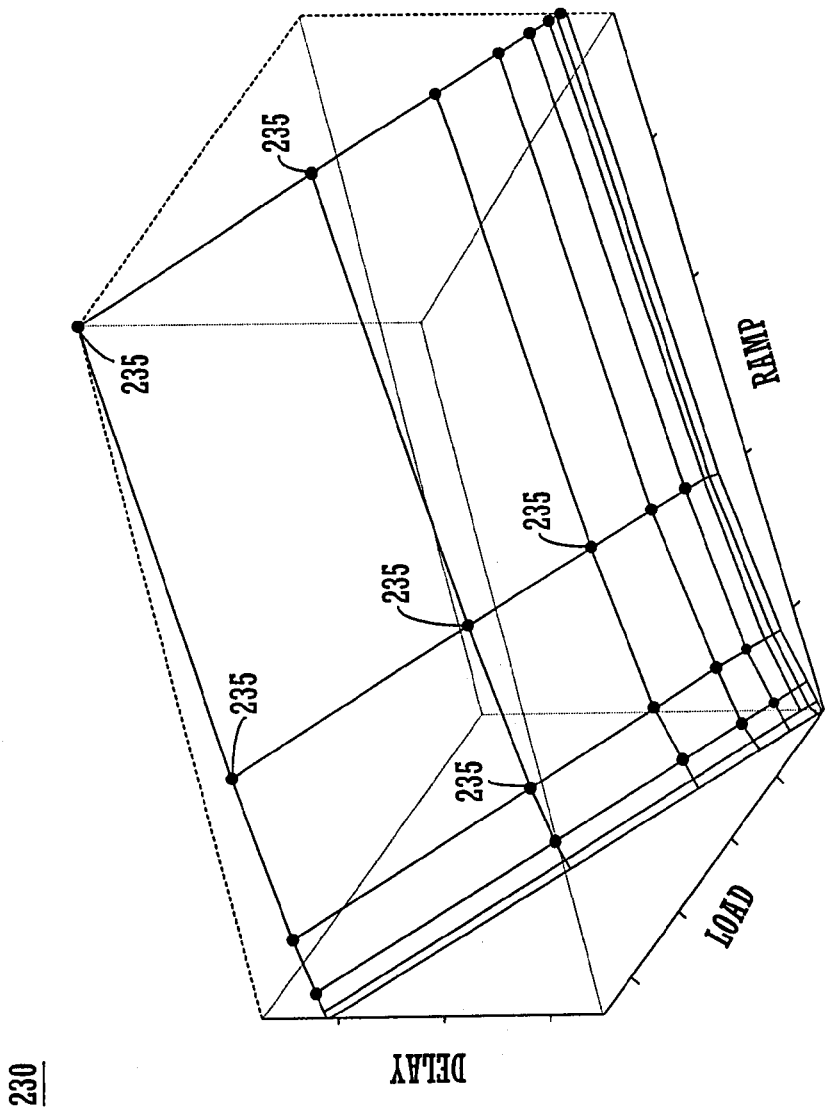
FIG. 6 illustrates a 6×10 look-up table data structure modeling the delay arc of an exemplary AOI circuit that is input to the translation processes of the present invention.

FIG. 6 illustrates a (6×10) table 230 that models the delay arc of an AOI cell. Within the bottom plane are the reference axis for the input transition rate ("ramp") input variable and the output load capacitance ("load") input variable. Table 230 illustrates that a look-up table need not be symmetrical with respect to the number of reference points along its input variables. The third dimension represents the 60 data points 235 of the look-up table 230. The data points 235 represent the delay through the timing or delay arc of the exemplary AOI cell for the corresponding input variables.

Figure 7:
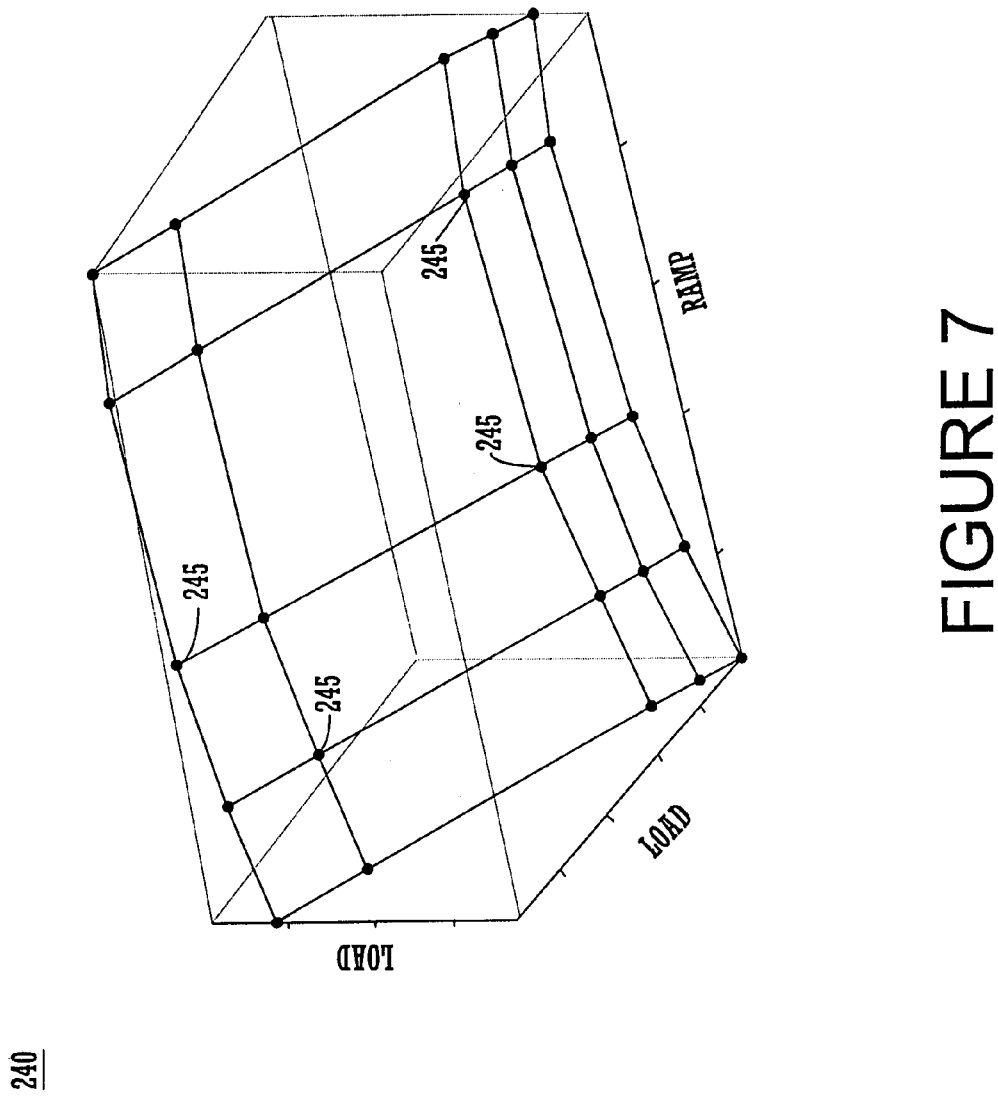
FIG. 7 illustrates a look-up table data structure modeling the delay arc of an exemplary sequential circuit that is input to the translation processes of the present invention.
Figure 8:
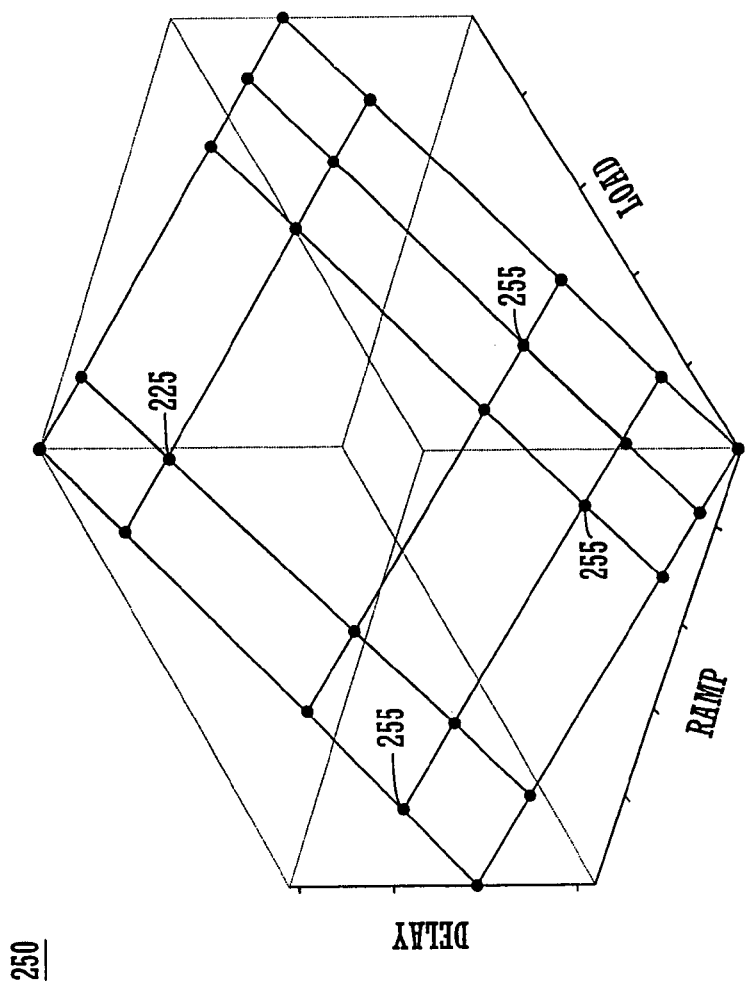
FIG. 8 illustrates a look-up table data structure modeling the latch set-up time of an exemplary circuit that is input to the translation processes of the present invention.

Tables 200, 220 and 230 represent combinational logic. FIG. 7 illustrates a (5×5) table 240 that models the delay arc of a sequential cell. Within the bottom plane are the reference axis for the input transition rate ("ramp") input variable and the output load capacitance ("load") input variable. The third dimension represents the 25 data points 245 of the look-up table 240. The data points 245 represent the delay through the timing or delay arc of the exemplary sequential cell for the corresponding input variables. FIG. 8 illustrates a (5×5) table 250 that models the latch set-up time for a sequential cell. Within the bottom plane are the reference axis for the input transition rate ("ramp") input variable and the output load capacitance ("load") input variable. The third dimension represents the 25 data points 255 of the look-up table 250. The data points 255 represent the delay through the timing or delay arc of the exemplary sequential cell for the corresponding input variables.

Figure 9:
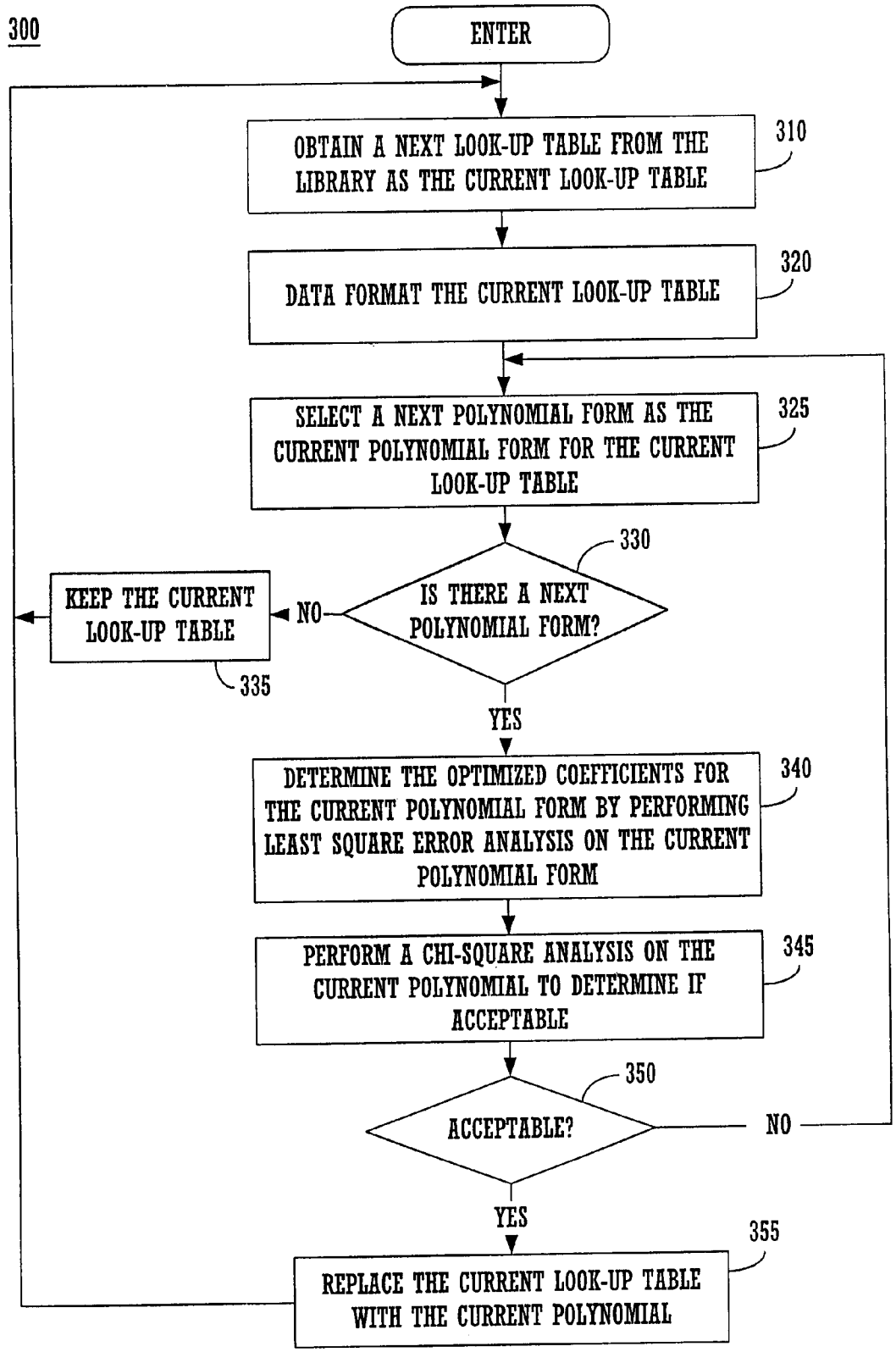
FIG. 9 illustrates steps of a translation process in accordance with the present invention for translating memory inefficient look-up table timing models (input) into memory efficient polynomial models (output using a set of scalable polynomials.

FIG. 9 illustrates steps in the look-up table translation process 300 of an embodiment of the present invention. Process 300 traverses through the look-up tables of a subject technology library and replaces look-up tables with polynomial forms for those tables that are replaceable in accordance with certain memory resource optimization criteria. The delay models of a minority of tables are so complex that the coefficients required of the replacing polynomial may not be derived from the given table or consume more memory than the table. In these rare cases, the original table is left unreplaced by process 300. Process 300 is realized as instruction code stored in computer readable memory units 102 of a computer system 112 and these instructions are executed by processor 101.

At step 310, a particular (a×b) look-up table (with associated variance data) of the given technology library is obtained from computer memory. This is the "current table" or "current look-up table." At step 320, an optional data formatting step is performed where the current table is "flattened" into a×b data points. For instance a 5×5 table is flattened into a function, f( ), having 25 data points. Also at step 320, the data preparation can involve operations on the standard deviation (also called sigma) that is received and associated with the current table. The sigma values represent the statistical error of the table data points (e.g., the SPICE simulation error values). The sigma values can be used straightforwardly, or certain weights can be imposed on table data values and variance values, to strike a balance on the minimization of the total error and the maximum error at any data point.

At step 325 of FIG. 9, the present invention selects an optimized polynomial form from among a predetermined set of scalable polynomial forms. This is the "current polynomial form." A specific number of coefficients is associated with each polynomial form and directly depends on the order of the polynomial. The current polynomial form is selected as a candidate for representing the data points of the current table. The process by which step 325 selects a next candidate polynomial form is described in more detail with respect to FIG. 10A and FIG. 10B. The predetermined scalable polynomial forms provided by one embodiment of the present invention include the decomposed Taylor Series. These polynomials each have an order of (m, n) and have (m+1)(n+1) number of coefficients based on their order. The predetermined scalable polynomial forms also include the Joint Taylor Series which each have an order of (n) and have (n+1)(n+2)/2 coefficients based on their order. Step 325 either (1) provides a next polynomial or (2) provides an indication that no polynomial could be selected.

At step 330, a determination is made as to whether or not step 325 was able to provide a valid polynomial form. For a variety of reasons, described with respect to FIG. 10A and FIG. 10B, step 325 may not provide a valid next polynomial form. In this case, the translation process 300 could not replace the current table with a polynomial model. As a result, step 335 is then entered where the current table is left unreplaced and process 300 returns to step 310 to obtain a next look-up table from the subject technology library. Step 335 is typically entered when the timing function represented by the current table is so complex or ill-behaved that more polynomial coefficients are required to model the table than there are data points of the table itself. In these irregular cases, polynomial replacement does not serve to reduce memory resource requirements for the current table and is therefore not performed on the current table.

Polynomial Candidate Selection 325

Figure 10A:
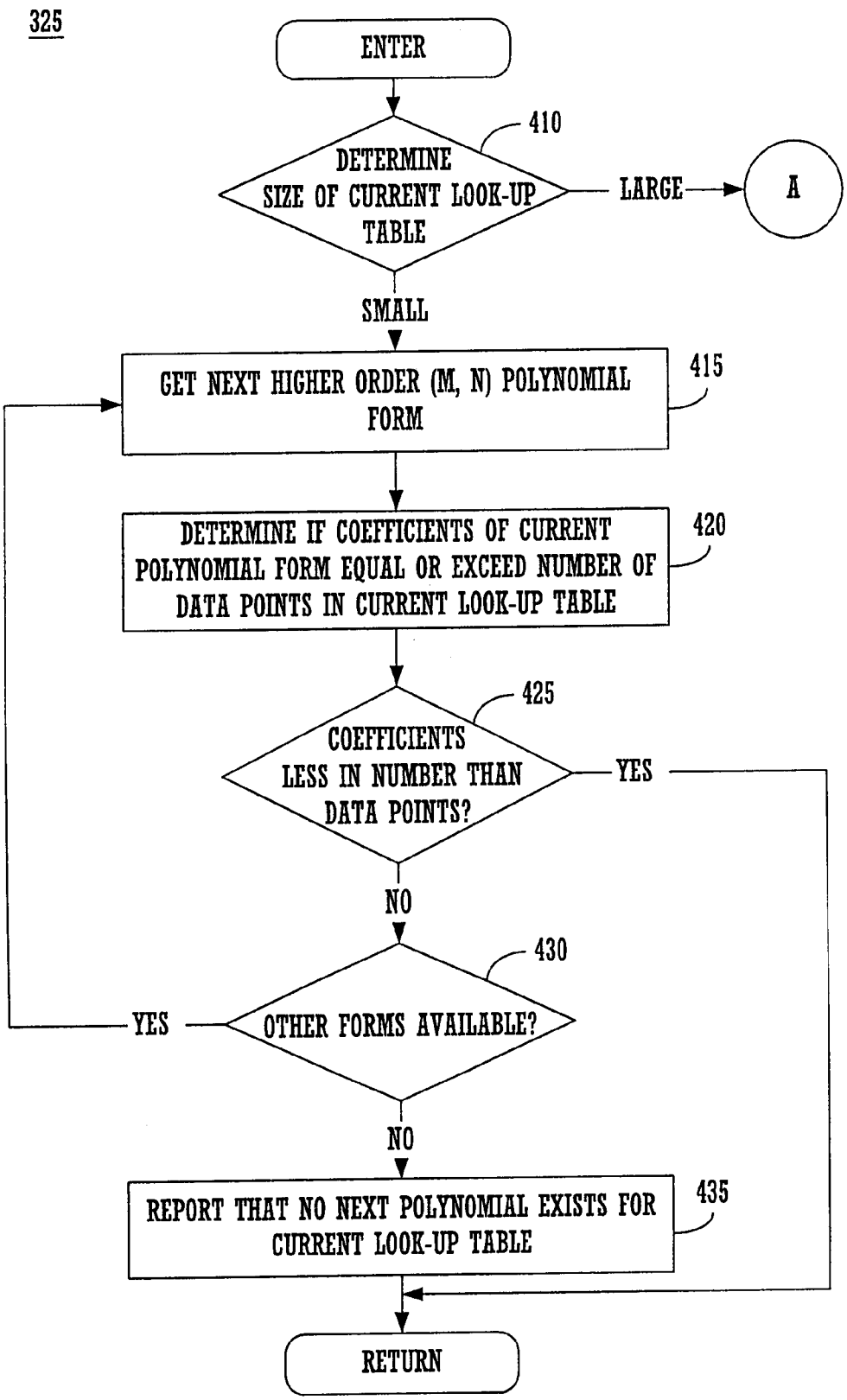
FIG. 10A illustrates steps of the polynomial form selection process of the translation process of FIG. 9 for input look-up tables that are equal to or less than a threshold size.
Figure 10B:
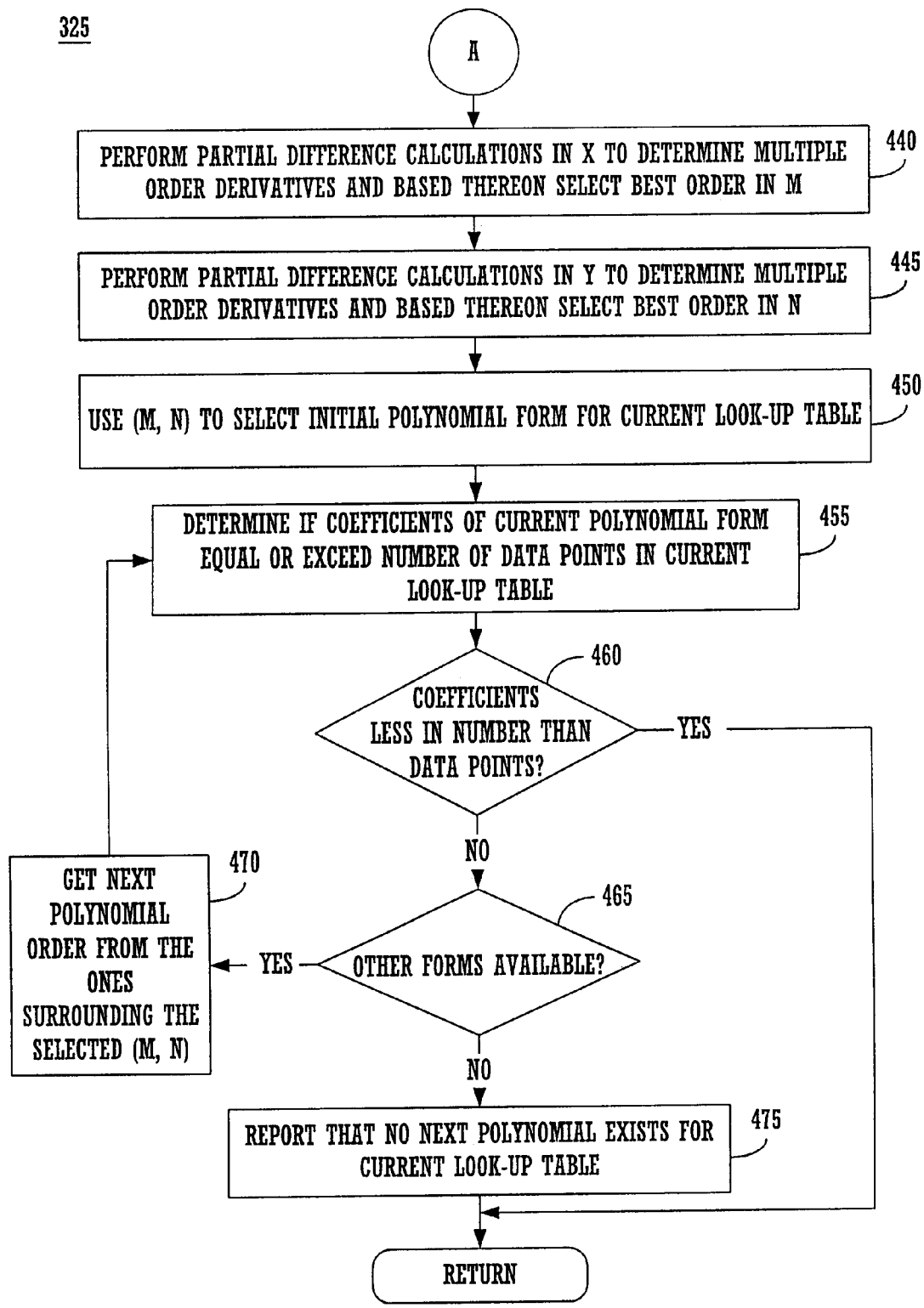
FIG. 10B illustrates steps of the polynomial form selection process of the translation process of FIG. 9 for input look-up tables that are more than the threshold size.

FIG. 10A and FIG. 10B illustrate the steps of process 325 used by the present invention for selecting a polynomial form, as a candidate for representing the current table, from among the predetermined set of polynomials. At step 410, the present invention checks the size of the current table. A threshold number of data points, T, is compared to the total number of data points of the current table. If the data points of the current table are larger than T, then the current table is "large" and processing flows to FIG. 10B. Otherwise, the table is considered "small" and step 415 is entered. The value of T is programmable and in one embodiment is 25 representing a typical table size of 5×5.

For small tables, the present invention incrementally traverses through the predefined set of polynomials trying ones having different orders (from lowest order to highest order) until it locates a polynomial form that adequately models the data of the current table. Therefore, step 325 can be executed a number of times for the current table. As a first step in this process, at step 415 of FIG. 10A, the present invention selects the next higher order polynomial form of the predetermined polynomial forms. The polynomial forms that are used in step 415 are described below.

FIG. 11 illustrates the predetermined polynomials forms that are used in one embodiment of the present invention. All polynomial forms are represented as functions, $D(x, y)$, of two input variables and the function represents the timing delay for the given timing arc and is based on the input variables. In one embodiment, these input variables correspond to the input transition rate (x) and the output load capacitance (y) of the timing arc. In one embodiment of the present invention, the predetermined polynomial forms include the decomposed Taylor Series polynomial forms 510 and the Joint Taylor Series polynomial forms 520.

The decomposed Taylor Series polynomial forms 510 are so named by the way they are constructed not that they are Taylor Series in the original form. For the decomposed Taylor Series, the function $D(x, y)=P_m(x) \times P_n(y)$, where $P_m$ is an m-th order and $Q_n$ is the n-th order polynomial. Here, P and Q are considered to be the n-th order Taylor Series polynomial on x and y, respectively. The decomposed Taylor Series polynomial forms 510 therefore have orders (m, n) and are represented as:

$$D(x, y)=(a0+a1x+a2x^2+ \ldots +amx^m) \times (b0+b1x+b2x^2+ \ldots +bnx^n)$$

which when multiplied out gives the form:

$$D(x,y)=a00+(a10x+a01y+a11xy)+(a02x^2+a20y^2+a12xy^2+a21x2y+a22x^2y^2)+$$

for an order (m, n) as shown by 515 of FIG. 11. A decomposed Taylor Series polynomial form has $[(m+1) \times (n+1)]$ number of coefficients where, in the above case, the aij terms are the coefficients.

The predetermined polynomial forms of the present invention also include the Joint Taylor Series polynomials 520 as shown in FIG. 11. For the Joint Taylor Series, the function $D(x, y)=R_n(x, y)$, where $R_n$ is an n-th order polynomial and is the regular joint variable Taylor expansion. The Joint Taylor Series polynomial forms 520 therefore have orders (n) and are represented as:

$$D(x, y)=a00+(a10x+a01y)+(a20x^2+a02y^2+a11xy)+$$

as shown by 520 of FIG. 11. An example of a third order (n=3) Joint Taylor Series polynomial is:

$$R3=b01+(b11x+b12y)+(b21x^2+b22xy+b23y^2)+(b31x^3+b32xy+b33xy^2+b34y^3)$$

A Joint Taylor Series polynomial form has $[(n+1) \times (n+2)/2]$ number of coefficients where, in the above case, the bij terms are the coefficients.

For small table sizes, step 415 of FIG. 10A exhaustively traverses the possible polynomial orders from the lowest to the highest in an incremental sequence when selecting the next polynomial form. As shown by the sequence in Table I, the polynomial orders are selected, in one embodiment, according to the number of coefficients they generate with the smaller number of coefficients selected first. For a current table, step 415 selects one different polynomial form each time it is entered. As shown in FIG. 10A and FIG. 9, step 415 can be re-entered a number of times for the same table. Although a number of different traversal methods can be used, in one embodiment, the selection alternates between different orders of the Joint Taylor Series and decomposed Taylor Series polynomial form as the polynomials are traversed. For instance, one exemplary alternating sequence is shown in Table II below and another exemplary alternating sequence is shown in Table III below. Each selection number represents a new pass through step 325 for a same table.

TABLE I

| Selection # | Polynomial Form | Order | Coefficients |
|---|---|---|---|
| 1 | Decomposed Taylor | (0,1) | 3 |
| 2 | Decomposed Taylor | (1,1) | 4 |
| 3 | Decomposed Taylor | (1,2) | 6 |
| 4 | Decomposed Taylor | (2,1) | 6 |
| 5 | Decomposed Taylor | (0,2) | 6 |

TABLE I-continued

| Selection # | Polynomial Form | Order | Coefficients |
|---|---|---|---|
| 6 | Decomposed Taylor | (1,3) | 8 |
| 7 | Decomposed Taylor | (3,1) | 8 |
| 8 | Decomposed Taylor | (2,2) | 9 |
| 9 | Decomposed Taylor | (0,3) | 10 |
| 10 | Decomposed Taylor | (2,3) | 12 |
| 11 | Decomposed Taylor | (3,2) | 12 |
| 12 | Decomposed Taylor | (2,4) | 15 |
| 13 | Decomposed Taylor | (4,2) | 15 |
| 14 | Decomposed Taylor | (0,4) | 15 |
| 15 | Decomposed Taylor | (3,3) | 16 |
| . | | | |
| . | | | |
| . | | | |

TABLE II

| Selection # | Polynomial Form | Order |
|---|---|---|
| 1 | Decomposed Taylor | (0,1) |
| 2 | Joint Taylor | (1) |
| 3 | Decomposed Taylor | (1,0) |
| 4 | Joint Taylor | (2) |
| 5 | Decomposed Taylor | (1,1) |
| 6 | Joint Taylor | (3) |
| 7 | Decomposed Taylor | (2,0) |
| 8 | Joint Taylor | (4) |
| 9 | Decomposed Taylor | (0,2) |
| 10 | Joint Taylor | (5) |
| . | | |
| . | | |
| . | | |

TABLE III

| Selection # | Polynomial Form | Order |
|---|---|---|
| 1 | Joint Taylor | (1) |
| 2 | Decomposed Taylor | (0,1) |
| 3 | Joint Taylor | (2) |
| 4 | Decomposed Taylor | (1,0) |
| 5 | Joint Taylor | (3) |
| 6 | Decomposed Taylor | (1,1) |
| 7 | Joint Taylor | (4) |
| 8 | Decomposed Taylor | (0,2) |
| 9 | Joint Taylor | (5) |
| 10 | Decomposed Taylor | (2,0) |
| . | | |
| . | | |
| . | | |

In an alternative embodiment, orders of the decomposed Taylor Series are selected first followed by orders of the Joint Taylor Series as shown by Table IV. Table V illustrates an embodiment where the Joint Taylor Series selected before the decomposed Taylor Series.

TABLE IV

| Selection # | Polynomial Form | Order |
|---|---|---|
| 1 | Decomposed Taylor | (0,1) |
| 2 | Decomposed Taylor | (1,0) |
| 3 | Decomposed Taylor | (1,1) |
| 4 | Decomposed Taylor | (2,0) |
| 5 | Decomposed Taylor | (2,1) |
| 6 | Decomposed Taylor | (0,2) |
| 7 | Decomposed Taylor | (1,2) |
| 8 | Decomposed Taylor | (2,2) |
| 9 | Joint Taylor | (1) |
| 10 | Joint Taylor | (2) |

TABLE IV-continued

| Selection # | Polynomial Form | Order |
|---|---|---|
| 11 | Joint Taylor | (3) |
| 12 | Joint Taylor | (4) |
| . | | |
| . | | |
| . | | |

TABLE V

| Selection # | Polynomial Form | Order |
|---|---|---|
| 1 | Joint Taylor | (1) |
| 2 | Joint Taylor | (2) |
| 3 | Joint Taylor | (3) |
| 4 | Joint Taylor | (4) |
| 5 | Decomposed Taylor | (1,0) |
| 6 | Decomposed Taylor | (0,1) |
| 7 | Decomposed Taylor | (1,1) |
| 8 | Decomposed Taylor | (0,2) |
| 9 | Decomposed Taylor | (1,2) |
| 10 | Decomposed Taylor | (2,0) |
| 11 | Decomposed Taylor | (2,1) |
| 12 | Decomposed Taylor | (2,2) |
| . | | |
| . | | |
| . | | |

It is appreciated that step 415 of present invention can perform other polynomial traversal sequences (from lower order to higher order) in addition to those shown above and that the sequences of Tables I–V are exemplary only. Step 415 then outputs a code indicating the type of polynomial form selected (e.g., decomposed Taylor or Joint Taylor). In one embodiment, the code also indicates the polynomial order selected for the current polynomial form.

At step 420 of FIG. 10A, the present invention computes the number of coefficients required for the current polynomial form selected by step 415. For the decomposed Taylor Series of order (m, n), the number of coefficients computed is equal to $(m+1)(n+1)$. For the Joint Taylor Series of order (n), the number of coefficients computed is equal to $[(n+1)(n+2)/2]$. The present invention at step 420 then determines if the number of coefficients required to model the polynomial consumes more memory resources then the current table (with data points) consumes. In one embodiment, if the number of coefficients of the current polynomial form is equal to or greater than the number of data points of the current table (determined at step 425), then no memory is saved by replacing the current table. Also, when the number of data points is less than the number of coefficients, it is not possible to determine the coefficient values, and further, when the number of coefficients is equal to the number of data points, the Chi-Square test fails. In these cases, step 430 is entered. If memory savings are possible by performing a table replacement with the current polynomial form, then processing flows from step 425 to step 330 of FIG. 9 and step 325 returns the current polynomial form selected.

At optional step 430 of FIG. 10A, if there are other polynomial forms that have not been traversed by step 415, with respect to the current table, that have fewer coefficients then step 415 is entered again to select a next polynomial form as the current polynomial form. At step 430, if there are no other polynomial forms left that have fewer coefficients than the current polynomial, then step 435 is entered. At step 435, a report is generated indicating that none of the predetermined polynomial forms can be used to efficiently model the current able with respect to memory resource concerns. Step 325 then returns the report that the current table is not replaceable and step 330 of FIG. 9 is entered. Step 435 is entered only for the minority of tables and these tables are not replaced by polynomial forms in accordance with the present invention.

Figure 12A:
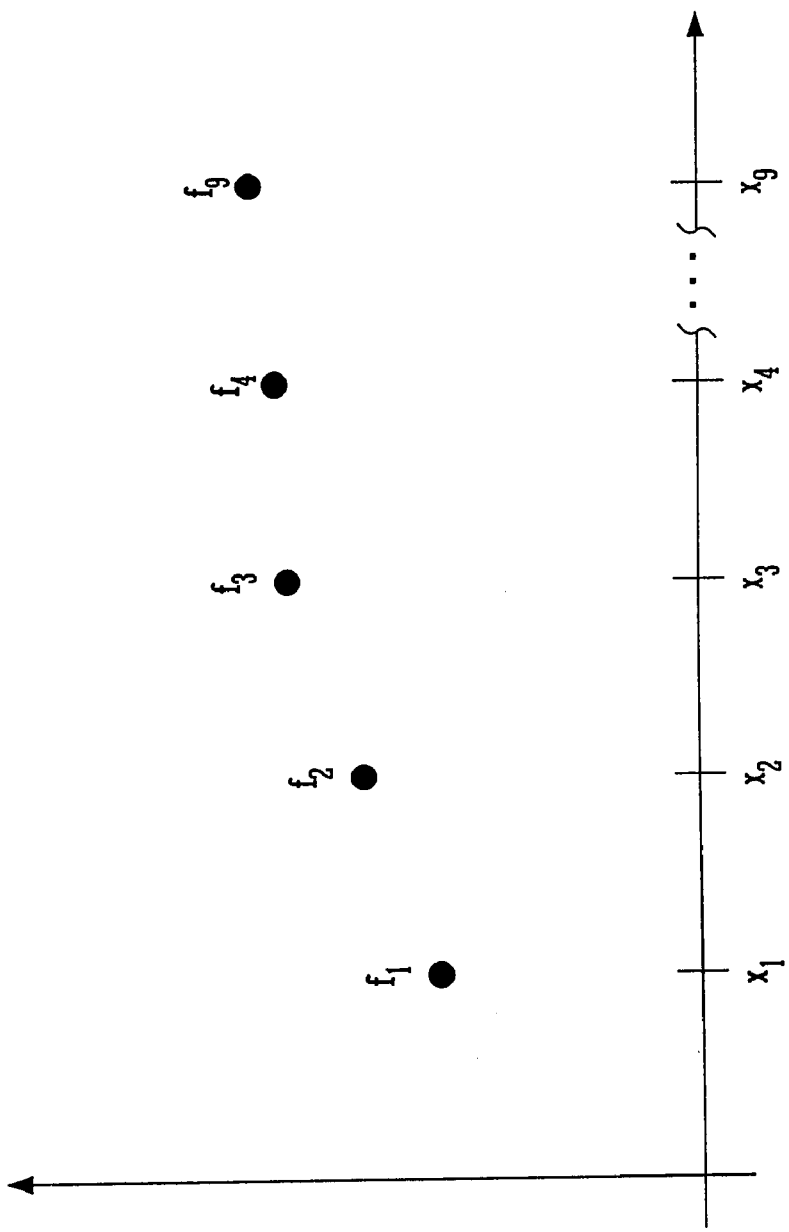
FIG. 12A illustrates the points of an input look-up table used during the numerical difference step of an embodiment of the present invention with respect to a first input variable (x).
Figure 12B:
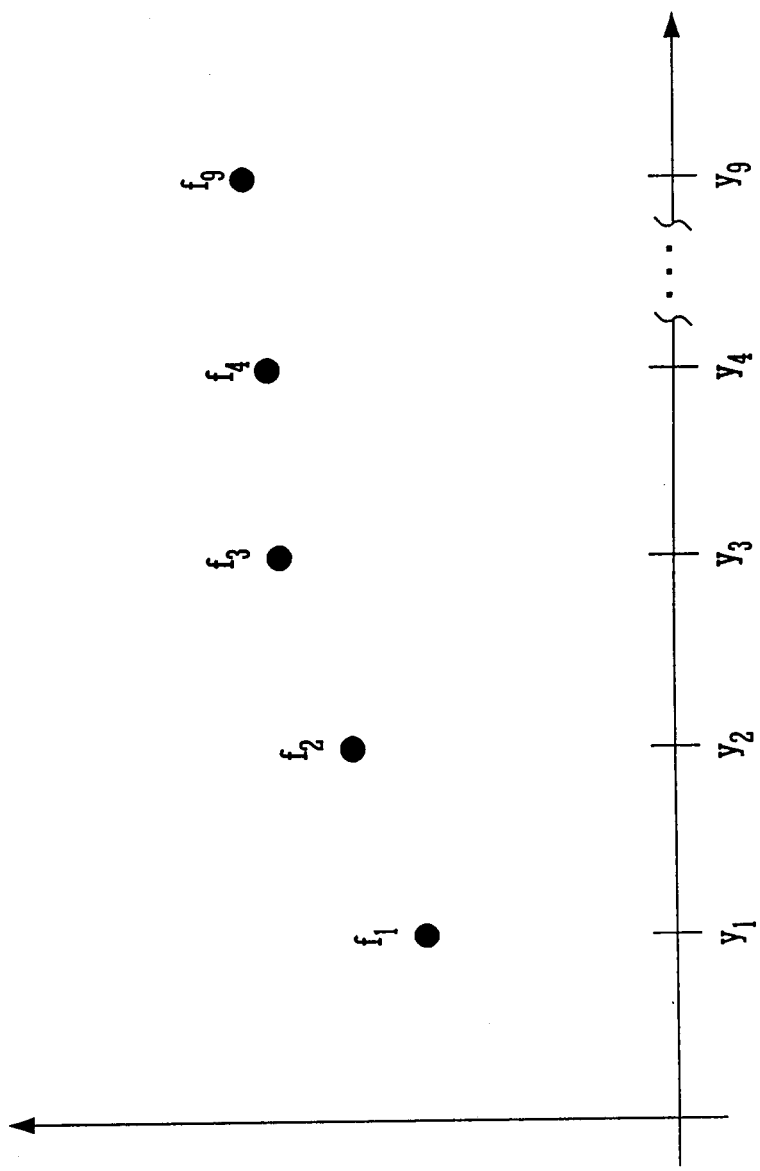
FIG. 12B illustrates the points of an input look-up table used during the numerical difference step of an embodiment of the present invention with respect to a second input variable (y).

FIG. 10B illustrates the steps of the polynomial selection process 325 for large tables. This embodiment of the present invention recognizes that the exhaustive sequential polynomial selection process of step 415 is not computationally efficient for large tables. Therefore, the present invention performs numerical difference calculations for large tables in an effort to estimate the best order of (m, n) for a selected polynomial form given the data points of the current table. FIG. 12A illustrates a graph 530 of the set of data points (f1 to f9) for an exemplary 3×3 table with respect to the x input variable. FIG. 12B illustrates a graph 540 of the set of data points (f1 to f9) for the exemplary 3×3 table with respect to the y input variable.

At step 440 of FIG. 10B, the present invention performs a numerical difference computation of a first order with respect to graph 530. This is, in effect, the numerical equivalent to computing the partial derivatives with respect to graph 530. The partial numerical difference computations involve computing the difference in the function divided by the difference in the input variable over two adjacent data points, for instance:

$$df/dx(2)=(f2-f1)/(x2-x1)$$

$$df/dx(3)=(f3-f2)/(x3-x2)$$

The above numerical difference computations for all data points f1 to f9 are computed at step 440. Also, the partial differentials are computed for the second, third and fourth orders using difference computations. The numerical difference computations for an order i are used to compute the differentials for the next order I+1 in well known ways. For instance, the second order differential for x3 is computed by:

$$=(df/dx(3)-df/dx(2))/(x3-x2)$$

and so on. At step 440, the numerical difference computations for the first, second and third orders of graph 530 are computed.

If the numerical differences for any particular order approach or come close to zero, then that order (and greater) is not needed in the selected polynomial. If the next lower order has significant numerical difference values, then the order for that polynomial is started at this next lower order. For instance, if the numerical differences of step 440 for a current table yield zero (or close to zero) for order 3 but large values result for the numerical differences of order 2, then m is selected at 2. Or, if the numerical differences of step 440 for a current table yield zero (or close to zero) for order 2 but significant values result for order 1, then m is selected at 1. On the first pass through step 440, the value m is the initial order selected for the polynomial. On any second or subsequent passes through step 440, for a same table, higher orders are then selected.

Step 445 is performed in an analogous fashion to step 440 but the numerical difference computations are performed with respect to the input variable y and on graph 540. The partial differentials (with respect to y) are computed by numerical difference computations for the second, third and fourth orders using numerical difference computations. If the differentials for any particular order approach or come close to zero, then that order (and greater) is not needed in the selected polynomial. If the next lower order has significant numerical difference computations, then the order for that polynomial is started at the next lower order. For instance, if the numerical difference computations of step 445 for a current table yield zero for order 3 but large values resulted for order 2, then n is selected at 2. Or, if the numerical difference computations of step 445 for a current table yield zero for order 2 but large values resulted for order 1, then n is selected at 1.

On the first pass through step 325, the value n is the initial order selected for the polynomial. On any second or subsequent passes through step 325, for the same table, higher or lower orders can be selected (step 470). A next order (m, n) is determined by the numeric difference computations at the completion of steps 440 and 445. It is appreciated that the numeric difference computations of steps 440 and 445 are not performed on small table sizes because the exhaustive sequential selection method of FIG. 10A operates more efficiently for small tables.

At step 450 of FIG. 10B, the polynomial form (m, n) selected at steps 440 and 445 is then checked to insure that memory savings result from the table translation. Step 450 is analogous to step 420 of FIG. 10A. If memory savings result from the table translation with the current polynomial form, then step 335 returns with the selected polynomial form (m, n). If memory savings do not result, then, at optional step 465, it is checked if there are other polynomial forms available, that have not been traversed by steps 440 and 445, but have fewer coefficients. If so, at step 470, a next polynomial order is selected and step 455 is entered again. The selection at 470 can be sequentially based and can be based on smaller orders than those initially selected at step 450. If no other polynomial forms are available at step 465, then step 475 is then entered. At step 475, a report is generated indicating that none of the predetermined polynomial forms can be used to efficiently model the current able with respect to memory resource concerns. Step 325 then returns the report that the current table is not replaceable and step 330 of FIG. 9 is entered. Step 475 is entered only for a minority of tables and these tables are not replaced by polynomial forms in accordance with the present invention.

With reference to FIG. 9, step 330 is entered at the completion of step 325. At step 330, if a report is received that the current table is not replaceable, then step 335 is entered. At step 335, the current table is left unreplaced in computer memory and step 310 is entered to obtain a next look-up table. At step 330, if step 325 returns a current polynomial, then step 340 is entered.

At step 340 of FIG. 9, the present invention computes the values of the coefficients for the selected polynomial form based on data points of the current table. As shown in FIG. 13, the well known linear least square error (LSE) curve fitting analysis 550 is used by the present invention at step 340. According to the LSE curve fitting analysis 550, yi is the ith sample point of the data table and Yi is the calculated value generated by the selected polynomial. Sigma(i) is the variance value input with each look-up table and indicates the statistical error for the data points of the table. Using well known methods, values of the coefficients of the selected polynomial are adjusted until the LSE curve fitting analysis 550 is minimized. By varying the coefficient values, the values Yi are varied. The LSE curve fitting analysis 550 represents the summation of the squared differences of the polynomial computed value (Yi) and the data value (yi) for all points referenced by the input variables x and y.

There are well known methods that can be used at step 340 for computing the values of the polynomial's coefficients given (1) a table of data points referenced by (x, y)

input variables and (2) a polynomial form for representing the data table. Any one of these well known LSE methods can be used at step 340. One such LSE method is described in Chapters 6 and 15 of the reference entitled "Numerical Recipes in C: The Art of Scientific Computing," by W. H. Press, S. A. Teukolsky, W. T. Vetterling and B. R. Flannery, published 1988–1992 by Cambridge University Press (ISBN 0-521-43108-5) which is incorporated herein by reference. One embodiment of the present invention utilizes the LSE method described in the above referenced chapters.

An example of the data structures used by step 340 is described with respect to FIGS. 14A and 14B. FIG. 14A illustrates an exemplary 3×3 table 560 having 9 data points f00 to f22. It is appreciated that variance data, sigma(0) to sigma(8), is also given for each data point of table 560. FIG. 14B illustrates that the following polynomial form:

$$f(x,y)=A+Bx+Cy+Dx^2$$

has been selected by step 325 to represent the 3×3 table 560. This polynomial form has four coefficients, A, B, C, and D, that need to be determined. Step 340 constructs a table 570. Table 570 contains a first column 570a that represents the number one divided by the variance. This is the "A" coefficient column. Column 570b represents the values of the input variable, x, for all data points, divided by the variance (the user supplied statistical error of the data points). This is the "B" coefficient column. Column 570c represents the values of the input variable, y, for all data points, divided by the variance. This is the "C" coefficient column. Column 570c represents the squared values of the input variable, x, for all data points, divided by the variance. This is the "D" coefficient column. Column 570f represents the 9 data points of the 3×3 table 560.

All of the entries of the table 570 of FIG. 14B are known values. The present invention at step 340 supplies tables analogous to table 570 to well known procedures (described in the above cited chapters 6 and 15) which determine values for the coefficients, A, B, C, and D, that minimize the LSE curve fitting analysis 550 of FIG. 13. Each column entry represents a number that when multiplied by its associated coefficient equals the polynomial's term value. Essentially, a matrix of (t+1) equations with t unknowns (the coefficients) is established and solved using well known matrix techniques. Step 325 ensures that there are never more coefficients (in the selected polynomial) than data points in the current table. The output of step 340 includes the current polynomial form and optimized values for each of its coefficients.

Figure 16:
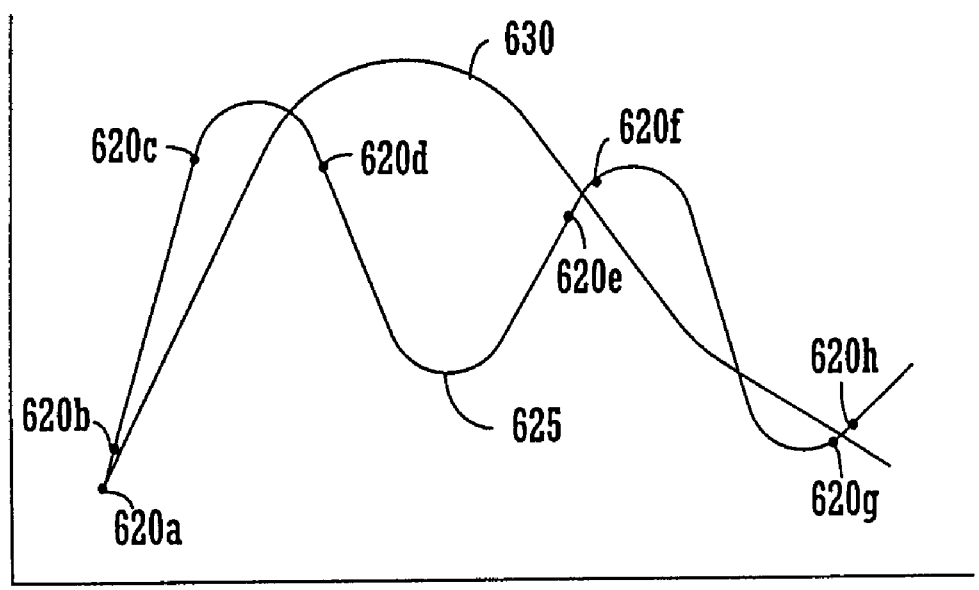
FIG. 16 is a diagram illustrating the problems associated with oscillations resulting from polynomial over-fitting.

Step 345 of FIG. 9 is provided to check for conditions that lead to over-fitting problems (e.g., curve oscillations). FIG. 16 illustrates an example of over-fitting a polynomial to a set of data points. Over-fitting occurs when a larger order polynomial is selected than is required to model the table data. For instance, data points 620a–620h represent the data points of a table. Curve 630 is the function of a polynomial of low order and curve 625 represents polynomial of high order. Although curve 625 matches the data points 620a–620h better than curve 630 matches them, the higher order curve 625 does not model the physical representation of the table well and the unwanted oscillations introduce a large amount of error between the data points. In this case, the lower order curve 630 actually yields a better model for the data points 620a–620h.

At step 345 of FIG. 9, the present invention utilizes the well known Chi-Square analysis 580 of FIG. 15 to determine the acceptability, with respect to over-fitting, of the current polynomial form with computed coefficient values. The Chi-Square analysis 580 is used to examine the entire fit of the selected polynomial to the current table and not just the fit at the data points. The input parameters to the Chi-Square analysis are 0.5 v and $0.5X^2$ where:

$v$=degrees of freedom=$(N-M)$ $X^2$=the LSE curve fitting sum minimized.

In the above parameters, N is the number of data points of the current table and M is the number of coefficients of the selected polynomial form. The Chi-Square analysis 580 tests the assumption that the current polynomial is correct by calculating a probability as the function of $X^2$ and v. The Chi-Squared probability value, $Q(0.5\ v, 0.5X^2)$, represents the matching level of the data set and the selected polynomial with computed coefficient values.

The sigma value is important in determining the acceptance of a polynomial because the timing data are statistical in nature. The acceptance of a polynomial depends on sigma with smaller sigma tightening the acceptance criterion and a zero sigma effectively disabling the curve fitting. The value of sigma also effects the coefficient values of the accepted polynomial. In accordance with the present invention, the value of sigma can be specified by the user to cover (1) the entire technology library; (2) for each type of table; (3) for each type of library cell; (4) for each type of timing arc; or (5) for each look-up table. In addition, either an absolute value or a percentage value relative to table entries can be specified.

At step 350, in accordance with one embodiment of the present invention, if the Chi-Squared value, $Q(0.5\ v, 0.5X^2)$, is larger than 0.1, then the selected polynomial is accepted. At step 355, since the current polynomial was accepted, it is used to replace the current table within the computer memory thereby reducing the memory resource requirements of the technology library. Replacement involves replacing the current table data structure with (1) a code indicating the particular type of polynomial form selected and (2) a set of values representing the coefficients for the selected polynomial.

Figure 19:
FIG. 19 illustrates a data structure used by the present invention for representing polynomial forms and coefficient values that are used to replace a look-up table within a subject technology library.
Figure 19:
Figure 19:

FIG. 19 illustrates a data structure 900 (stored in computer memory) that can be used to organize the replacements. FIG. 19 illustrates the above referenced codes stored within the entries of column 910b of data structure 900. The coefficient values are stored in entries of column 910c of data structure 900. Column 910a indicates the particular circuit path identifier. In this manner, each circuit path can have its own polynomial form and coefficient values. In one embodiment, the code used to represent the polynomial is the order of the polynomial, e.g., order(m, n) or order(n). Processing then returns to step 310 of FIG. 9 to access another look-up table for replacement analysis.

At step 350 of FIG. 9, if the current polynomial is not accepted then either it does not match the table data well or there is an over-fitting problem. In either case, processing returns to step 325 to select another polynomial form, and/or another polynomial order, and the above discussed steps are repeated until an acceptance occurs (at step 350) or the table is left as unreplaced (at step 335).

As discussed above, the table replacement or translation process 300 of the present invention leads to some dramatic results with respect to memory savings. By replacing look-up table data structures with polynomial form codes (and computed coefficient values), as much as 94.3% of the memory used to store tables can be eliminated (e.g., in one case 74 M bytes required to 4.21 M bytes required) without any significant reduction in computation accuracy due to the provision of separate polynomial forms for each table.

Figure 17A:
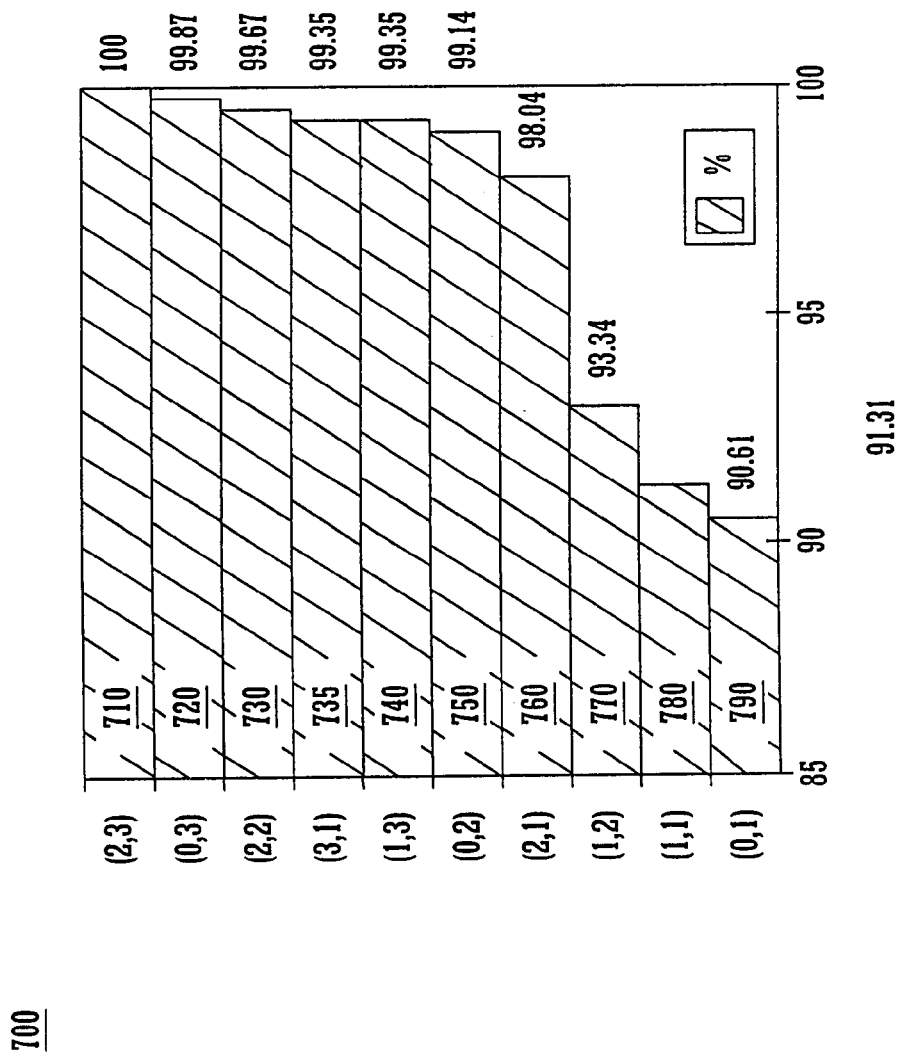
FIG. 17A is an illustration of an exemplary accumulated order distribution generated by the present invention when applied to exemplary technology libraries for accepted polynomials.

FIG. 17A illustrates a graph 700 the accumulated order distributions for an average exemplary technology library processed by process 300 of the present invention. An large percentage of tables were replaced with very low order polynomials (linear) while over 99 percent require no more than 2nd order polynomial forms. As shown, 90.61 percent of the replaced tables (bar 790) were replaced by polynomials of order (0,1). The next 0.7 percent (91.31–90.61) of the replaced tables were replaced by polynomials of order (1,1). The next 2.03 percent of the replaced tables were replaced by polynomials of order (1,2). The next 4.7 percent of the replaced tables were replaced by polynomials of order (2,1). Further, 1.1 percent were replaced by (0,2) orders; no (1,3) orders were used; 0.32 percent were replaced by (2,2) orders; 0.20 percent were replaced by (0,3) orders; and the remaining 0.13 percent were replaced by (2,3) orders. In this example the coverage was 94.9 percent, therefore 5.1 percent of the tables of the technology library were unreplaceable. A 5 percent variance, e.g., sigma, was used.

Figure 17B:
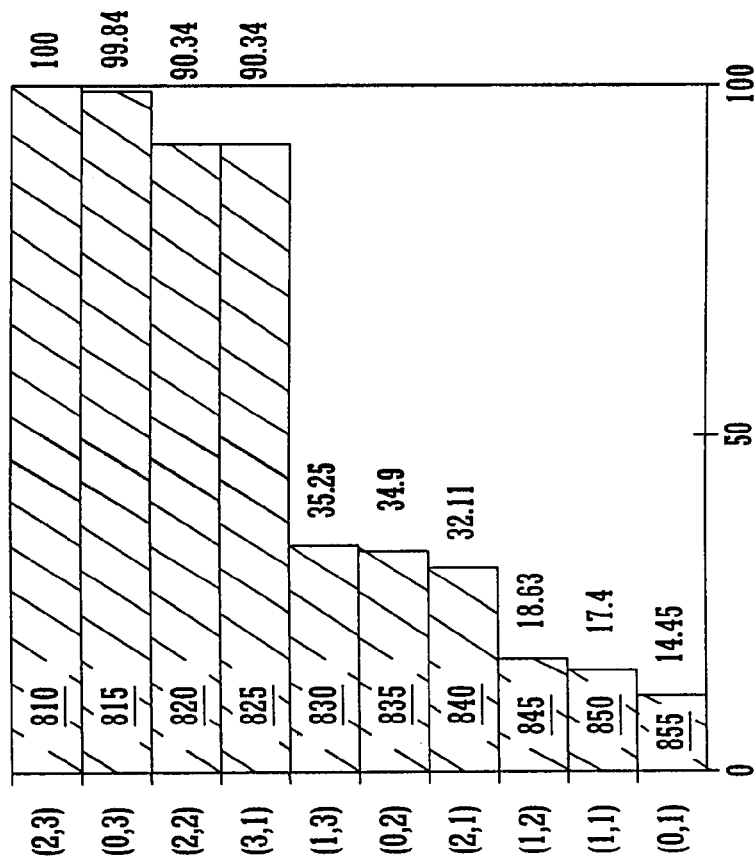
FIG. 17B is an illustration of an exemplary accumulated order distribution generated by the present invention when applied to exemplary technology libraries for rejected polynomials.

FIG. 17B illustrates a graph 800 the accumulated order distributions for a worst case technology library processed by process 300 of the present invention. In this case, the variance was 5 percent and there was only 54.87 percent coverage and the distribution is skewed toward third order polynomial forms with over half of the replaced tables using a (3,1) order polynomial (bar 825).

Timing Computation Process 800 of the Present Invention

Figure 18:
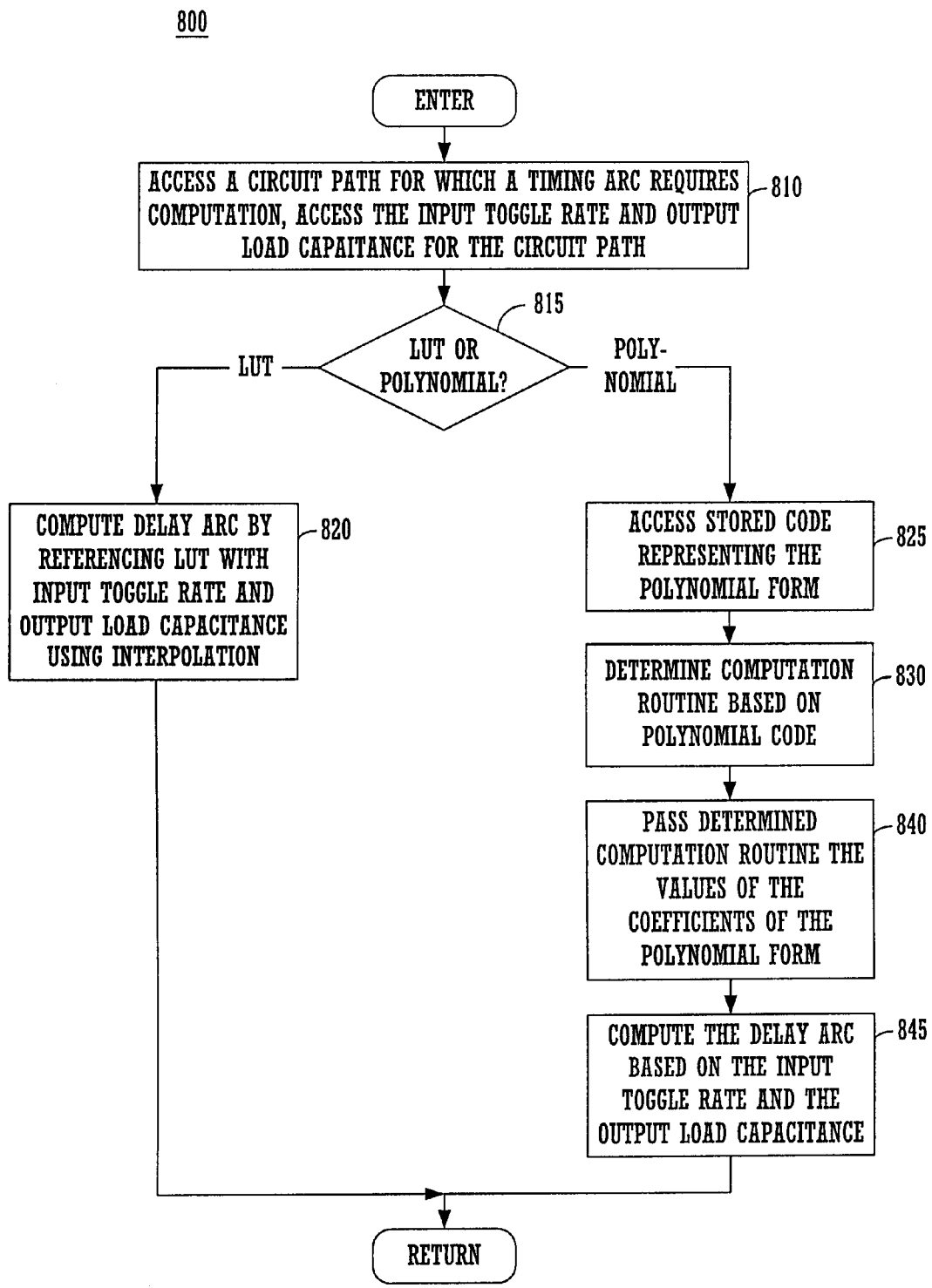
FIG. 18 illustrates steps performed by the present invention for using the scalable polynomials for performing timing delay computations.

The evaluation of a polynomial can be made efficient by dispatching of lower ordered polynomials to a set of tightly written routines and having optimized routines for the general cases (see section below for exemplary polynomial computation routines). FIG. 18 illustrates a process 800 used by one embodiment of the present invention for performing timing computations using the polynomial timing models generated by process 300 of the present invention. Process 800 is implemented as instruction code stored within computer readable memory units of computer system 112 and executed on processor 101.

Process 800 commences at step 810 were a circuit path (of a particular netlist design) is accessed for which a timing arc needs to be computed. The input variables, e.g., the input transition rate for the circuit path and the output load capacitance for the circuit path are obtained. An index for the circuit path is then obtained indicating the location storing the timing model to be used for this circuit path. At step 815, the present invention checks if this obtained index points to a look-up table data structure (LUT) or points to a polynomial that was inserted as a result of process 300 of the present invention. If a LUT is indicated, then step 820 is entered, otherwise step 825 is entered.

At step 820, the delay value for the circuit path is computed using the LUT and interpolation methods which are well known in the art. In one well known method, using the output load capacitance and the input transition rate, four data points are returned from the LUT and interpolation is used to compute the delay arc information for the particular input values. The delay arc information is then returned and process 800 is entered again for a new circuit path.

At step 825 of FIG. 18, the model for the circuit path is not a LUT but a polynomial. At step 825, the present invention accesses a stored code that indicates the polynomial form associated with the circuit path (see column 910*b* of data structure 900 of FIG. 19) from a set of predetermined polynomial form codes. In one embodiment, the code is an indication of the order of the polynomial form, e.g., (m, n) or (n). Also, the set of computed values for the coefficients of the polynomial form are also obtained (see column 910*c* of data structure 900 of FIG. 19). At step 830 of FIG. 18, the present invention then determines the address of a custom computation routine written for the particular polynomial form. This information can be obtained from a computer table storing index codes versus address information. The section below illustrates some exemplary computation routines that can be used for particular polynomial form in accordance with the present invention.

At step 840, the present invention passes to the identified computation routine (1) the values of the set of coefficients for the polynomial form; (2) the input transition rate and (3) the output load capacitance for the circuit path. At step 845, the particular identified computation routine then computes and outputs the delay arc information based on the supplied inputs. The delay arc information is then returned and process 800 is entered again for a new circuit path.

---

EXEMPLARY POLYNOMIAL COMPUTATION ROUTINES

```
#include "generic.h"
#include "poly_int.h"
/
******************************************************
*
Constant
******************************************************
*/
static float
poly_eval_00 (float *coef, float x, float y)
{
        return coef [0] ;
}
/
******************************************************
*
        j = 01
i =
    0   1.0
    1   x       y
******************************************************
/
static float
poly_eval_01 (float   *coef, float x, float y)
{
        return coef [0] + x*coef [1] + y*coef [2] ;
}
/
******************************************************
*
        j = 01   2
i =
    0   1.0
    1   x       y
    2   x^2     x*y     y^2
******************************************************
/
static float
poly_eval_02 (float *coef, float x, float y)
{
        return coef [0]  + x * (coef [1] + coef[3] * x + coef [4] *y)
                       + y * (coef [2] + coef[5] * y) ;
}
/
1D linear
******************************************************
/
static float
poly_eval_10   (float *coef, float x, float y)
{
        return coef[0] + x * coef [1] ;
}
/
******************************************************
        0       1
    0   1.0     y
```

EXEMPLARY POLYNOMIAL COMPUTATION ROUTINES

```
                1         x         x*y
/**********************************************************/
static float
poly_eval_11 (float *coef, float x, float y)
{
        return coef [0] + y*coef [1] + x* (coef [2] + y*coef [3] ) ;
}
/**********************************************************
                0         1         2
        0       1.0       y         y^2
        1       x         x*y       x*y^2
/**********************************************************/
static float
poly_eval_12 (float *coef, float x, float y)
{
        return coef [0] + y * (coef [1] + y * coef [2] +
          x * (coef[3] + y * (coef[4] + y * coef [5] ) ) ;
}
/
1D square
**********************************************************/
static float
poly_eval_20 (float *coef, float x, float y)
{
return coef[0] + x * (coef [1] + x * coef [2] ) ;
}
/
**********************************************************
                0         1
        0       1.0       y
        1       x         x*y
        2       x^2       x^2*y
/**********************************************************/
static float
poly_eval_21 (float *coef, float x, float y)
{
        return coef [0] + y * coef [1] +
          x * (coef[2] + y * coef [3]
             + x * (coef [4] + y * coef [5] ) ) ;
}
/
**********************************************************
                0         1         2
        0       1.0       y         y^2
        1       x         x*y       x*y^2
        2       x^2       x^2*y     x^2*y^2
/**********************************************************/
static float
poly_eval_22 (float *coef, float x, float y)
{
        return coef [0] + y * (coef [1] + y * coef [2] +
          x * (coef [3] + y * (coef [4] + y * coef [5] ) +
             x * (coef [6] + y * (coef [7] + y * coef [8] ) ) ) ;
}
typedef float (*poly_eval_fN_type) (float *coef, float x,
             float y) ;
static poly_eval_fN_type poly_eval_fN_array, [3] [3] =
{
        {poly_eval_00, poly_eval_01, poly_eval_02},
        {poly_eval_10, poly_eval_11, poly_eval_12},
        {poly_eval_20, poly_eval_21, poly_eval_22}
};
/
**********************************************************
        m = coef->m, n = coef->n; m, n > 0
coef->coef is 1-D packaging of an (m + 1) X (n + 1) matrix. row
first.
   m       n
Sum    Sum     Cij   * x^i   * y^j,   Cij = coef [ i * (n + 1) + j+1]
i = 0   j = 0
Example matrix (m = 2, n =3) :
                0         1         2         3
        0       1.0       y         y^2       y^3
        1       x         x*y       x*y^2     x*y^3
        2       x^2       x^2*y     x^2*y^2   x^2*y^3
**********************************************************/ static float
poly_eval_dt (poly_coef *coef, float x, float y)
{
        float     *f, result, r;
        int       I, j;
result =  0.0;
f    =    coef->coef + (coef ->m+1) * (coef ->n+1) - 1;
for (i = coef ->m; i >= 0; I--) {
        r = 0.0;
        for (j = coef->n; j > = 0; j--, f--) {
            r = ( *f) + r * y;
        }
result = r + result * x;
}
return result ;
}
/**********************************************************
        n = coef->n    (coef->m == 0)
coef->coef is 1D packaging of a lower-left triangular matrix,
main diagonal included. row first.
   n       i
Sum    Sum     Cij   * x^i   * y^j,   Cij = coef[k], k = index (i, j)
i = 0   j = 0
Example matrix (n =4) :
             j =  0         1         2         3         4
        i =
        0       1.0
        1       x         y
        2       x^2       x *y      y^2
        3       x^3       x^2*y     x *y^2    y^3
        4       x^4       x^3*y     x^2*y^2   x*y^3    y^4
**********************************************************/
static float
poly_eval_jt (poly_coef *coef, float x, float y)
{
float          *f,      *cf, result, r;
int            j,       k,     n;
n = coef->n;
cf = coef->coef + n * (n + 1) / 2;
result = 0.0;
for (k = 0; k < = n; k++, cf++)     { / * by diagonal * /
     r = 0.0 ;
     f = cf;
     for (j = n + 1; j > = n +1-k; j - -) {
        r = ( *f) + r * y;
        f - = j;
     }
        result = r + result * x;
}
return result;
}
/**********************************************************
**********************************************************/
float
poly_eval_0D (poly_coef *coef)
{
        return coef->coef[0] ;
}
/**********************************************************
        C0 + C1 * X + C2 * X^2 + ... + Cm*X^m
**********************************************************/
float
poly_eval_1D (poly_coef *coef, float x)
{
        float     result,   *f, *cf;
if    (coef->m  < 3)   {
        result =poly_eval_fN_array[coef->m] [0] (coef->coef,
            x,0.0);
} else {
        result = 0.0;
cf        = coef->coef;
for (f = cf   + coef ->m; f > = cf; f--)     {
        result = (*f) + x * result;
}
}
        return result;
}
```

-continued

EXEMPLARY POLYNOMIAL COMPUTATION ROUTINES

```
/
**************************************************************
        (m, n) =
            (>0,    0) :    1D
            ( 0,   >0) :    jt
            (>0,   >0) :    dt
            ( 0,    0) :    scalar
**************************************************************/
float
poly_eval (poly_coef *coef, float x, float y)
{
        float  result = ARITHMTC_UNINIT;
        if (coef - >m > = 0  && coef - > n > = 0 &&
        coef ->m < 3 &&
coef - >n < 3 )     {
            result=poly_eval_fN_array[coef->m] [coef->n]
            (coef ->coef,x,y);
} else if (coef - >m = = 0 && coef - > n > 0 )   {
result = poly_eval_jt (coef, x, y) ;
} else if ( coef->m > 0 && coef->n > 0)   {
            result = poly_eval_dt (coef, x, y ) ;
} else if (coef->m > 0 && coef ->n == 0 )    {
            result = poly_eval_1D (coef, x) ;
}
return result ;
}
```

The description above is focused on timing data as a function of two input variables to illustrate an exemplary application of the present invention. While this application is very useful, it is appreciated that the scope of the present invention is a set of polynomials used for memory efficient numerical computation, with some look-up tables used as a safe haven for those data that do not fit the polynomial paradigm. The present invention is equally well suited for application to power data as to timing data, and can be expanded to include functions of more than two input variables. In the case of timing data, voltage and temperature can also be incorporated into the system in an organized fashion.

The preferred embodiment of the present invention, a system and method for using polynomials to translate a look-up table delay model into a memory efficient model, is thus described. While the present invention has been described in particular embodiments, it should be appreciated that the present invention should not be construed as limited by such embodiments, but rather construed according to the below claims.

What is claimed is:

1. A computer implemented method comprising the steps of:
   a) accessing from memory a look-up table data structure for a cell, said look-up table data structure having timing data points each referenced by first and second input variables;
   b) translating said look-up table data structure into a selected polynomial form having a selected order and a set of coefficients and further having, as input variables, an input transition rate and an output load capacitance, wherein said selected polynomial form is selected out of a predetermined set of scalable polynomial forms;
   c) in said memory, replacing said look-up table data structure with said selected polynomial form;
   d) repeating steps a)–c) for a plurality of cells of a technology library stored in said memory; and
   e) using said selected polynomial forms to estimate timing delays through timing arcs of said plurality of cells of said technology.

2. A computer implemented method as described in claim 1 wherein said first input variable is an input transition rate of an input of said cell and wherein said second input variable is an output load capacitance of an output of said cell.

3. A computer implemented method as described in claim 2 wherein said step b) comprises the steps of:
   b1) out of said predetermined set of scalable polynomial forms, selecting a first polynomial form of a first selected order, said first polynomial form having a first set of coefficients;
   b2) determining values for said first set of coefficients by performing a linear least square error curve fitting computation on said timing data points with respect to said first polynomial form;
   b3) performing a Chi-Square computation with respect to said timing data points and said first polynomial form including said values determined at step b2) to obtain a Chi-Square result;
   b4) accepting said first polynomial form including said values determined at step b2) provided said Chi-Square result is greater than a given threshold; and
   b5) provided said Chi-Square result is not greater than said given threshold, repeating steps b2)–b4) with respect to a second polynomial form having a second selected order and a second set of coefficients, wherein said second polynomial form is selected out of said predetermined set of scalable polynomial forms.

4. A computer implemented method as described in claim 3 wherein said first polynomial form is a Decomposed Taylor polynomial of order (m, n) and wherein said firs set of coefficients comprises [(m+1)×(n+1)] coefficients.

5. A computer implemented method as described in claim 3 wherein said first polynomial form is a Decomposed Taylor Series polynomial of order (n) and wherein said first set of coefficients comprises [[(n+1)×(n+2)]/2] coefficients.

6. A computer implemented method as described in claim 3 wherein, in number, said first set of coefficients is less said timing data points.

7. A computer implemented method as described in claim 3 wherein said given threshold is 0.1.

8. A computer system comprising a processor coupled to a bus and a memory unit coupled to said bus, said memory unit having stored therein instructions that when executed implement a method comprising the steps of:
   a) accessing from memory a look-up table data structure for a cell, said look-up table data structure having timing data points that are each referenced by an input transition rate input variable and an output load capacitance input variable;
   b) translating said look-up table data structure into a selected polynomial form having a selected order and a set of coefficients and further having, as input variables, said input transition rate and said output load capacitance, wherein said selected polynomial form is selected out of a predetermined set of scalable polynomial forms;
   c) in said memory, replacing said look-up table data structure with said selected polynomial form;
   d) repeating steps a)–c) for a plurality of cells of a technology library stored in said memory; and
   e) using said selected polynomial forms to estimate timing delays through timing arcs of said plurality of cells of said technology library.

9. A computer system as described in claim 8 wherein said step b) of said method comprises the steps of:

b1) out of said predetermined set of scalable polynomial forms, selecting a first polynomial form of a first selected order, said first polynomial form having a first set of coefficients;

b2) determining values for said first set of coefficients by performing a linear least square error curve fitting computation on said timing data points with respect to said first polynomial form;

b3) performing a Chi-Square computation with respect to said timing data points and said first polynomial form including said values determined at step b2) to obtain a Chi-Square result;

b4) accepting said first polynomial form including said values determined at step b2) provided said Chi-Square result is greater than a given threshold; and b5) provided said Chi-Square result is not greater than said given threshold, repeating steps b2)–b4) with respect to a second polynomial form having a second selected order and a second set of coefficients, wherein said second polynomial form is selected out of said predetermined set of scalable polynomial forms.

10. A computer system as described in claim 8 wherein said first polynomial form is a Joint Taylor Series polynomial of order (m, n) and wherein said first set of coefficients comprises $[(m+1)\times(n+2)]$ coefficients.

11. A computer system as described in claim 8 wherein said first polynomial form is a Joint Taylor Series polynomial of order (n) and wherein said first set of coefficients comprises $[[(n+1)\times(n+2)]/2]$ coefficients.

* * * * *

UNITED STATES PATENT AND TRADEMARK OFFICE
CERTIFICATE OF CORRECTION

PATENT NO. : 6,732,341 B1
DATED : May 4, 2004
INVENTOR(S) : Shir-Shen Chang et al.

It is certified that error appears in the above-identified patent and that said Letters Patent is hereby corrected as shown below:

Column 22,
Line 31, insert -- Series -- after "Taylor"; and replace "firs" with -- first --.
Line 34, replace "Decomposed" with -- Joint --.

Column 24,
Line 8, replace "Joint" with -- Decomposed --.
Line 10, replace "[(m+1)×(n+2)]" with -- [(m+1)×(n+1)] --.

Signed and Sealed this

Thirty-first Day of August, 2004

JON W. DUDAS
*Director of the United States Patent and Trademark Office*